US012738442B2

(12) United States Patent
Fukuta et al.

(10) Patent No.: US 12,738,442 B2
(45) Date of Patent: Sep. 15, 2026

(54) CHARGED PARTICLE BEAM DEVICE AND SPECIMEN OBSERVATION METHOD

(71) Applicant: Hitachi High-Tech Corporation, Tokyo (JP)

(72) Inventors: Masahiro Fukuta, Tokyo (JP); Tomoyo Sasaki, Tokyo (JP); Makoto Suzuki, Tokyo (JP); Masashi Wada, Tokyo (JP); Hiroshi Nishihama, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 398 days.

(21) Appl. No.: 18/027,191

(22) PCT Filed: Oct. 26, 2021

(86) PCT No.: PCT/JP2021/039460
§ 371 (c)(1),
(2) Date: Mar. 20, 2023

(87) PCT Pub. No.: WO2022/092077
PCT Pub. Date: May 5, 2022

(65) Prior Publication Data

US 2023/0343549 A1 Oct. 26, 2023

(30) Foreign Application Priority Data

Oct. 28, 2020 (WO) .................. PCT/JP2020/040350

(51) Int. Cl.
*H01J 37/244* (2006.01)
*G01N 23/2251* (2018.01)
(Continued)

(52) U.S. Cl.
CPC .......... *H01J 37/10* (2013.01); *G01N 23/2251* (2013.01); *H01J 37/1474* (2013.01);
(Continued)

(58) Field of Classification Search
None
See application file for complete search history.

(56) References Cited

U.S. PATENT DOCUMENTS 4,277,679 A * 7/1981 Feuerbaum ........... H01J 49/488 324/754.22
2013/0126733 A1 5/2013 Fukuda et al.
(Continued)

FOREIGN PATENT DOCUMENTS

JP 49-68653 A 7/1974
JP 49-84360 A 8/1974
(Continued)

OTHER PUBLICATIONS

Korean-language Office Action issued in Korean Application No. 10-2023-7006888 dated Nov. 27, 2024, with English translation (14 pages).
(Continued)

*Primary Examiner* — James Choi
(74) *Attorney, Agent, or Firm* — Crowell & Moring LLP

(57) ABSTRACT

The present invention overcomes a trade-off between throughput, SNR, and spatial resolution in a charged particle beam device. Accordingly, a computer 18 sets at least one of a charged particle optical system and a detection system so as to modulate the intensity of signal charged particles or an electromagnetic wave detected by a detector 12 at a prescribed frequency. The charged particle optical system scans a specimen with a charged particle beam. The computer 18 generates an image or a signal profile by associating an irradiation position of the charged particle beam with a DC component of a signal acquired through synchronous detection of a detection signal from the detector at the irradiation position with a reference signal having a prescribed frequency.

17 Claims, 17 Drawing Sheets

(51) Int. Cl.

| | |
|---|---|
| ***H01J 37/10*** | (2006.01) |
| ***H01J 37/147*** | (2006.01) |
| ***H01J 37/28*** | (2006.01) |

(52) U.S. Cl.

CPC ............ *H01J 37/244* (2013.01); *H01J 37/28* (2013.01); *G01N 2223/505* (2013.01); *H01J 2237/0492* (2013.01); *H01J 2237/2443* (2013.01); *H01J 2237/24495* (2013.01)

(56) References Cited

U.S. PATENT DOCUMENTS

| | | | | |
|---|---|---|---|---|
| 2015/0364296 | A1 | 12/2015 | Nomaguchi et al. | |
| 2016/0005566 | A1 | 1/2016 | Zewail et al. | |
| 2019/0035600 | A1 * | 1/2019 | Sakai ..................... | H01J 37/265 |
| 2020/0080949 | A1 * | 3/2020 | Nishitani ............. | G01N 23/203 |
| 2020/0111638 | A1 | 4/2020 | Araki et al. | |

FOREIGN PATENT DOCUMENTS

| | | | | | |
|---|---|---|---|---|---|
| JP | S49068653 | U | * | 10/1974 | |
| JP | 59-96759 | U | | 6/1984 | |
| JP | S5996759 | U | * | 6/1984 | |
| JP | 60-31112 | A | | 2/1985 | |
| JP | S6031112 | A | * | 2/1985 | |
| JP | 63-27033 | A | | 2/1988 | |
| JP | S6327033 | A | * | 2/1988 | |
| JP | 5-275045 | A | | 10/1993 | |
| JP | 2016-189332 | A | | 11/2016 | |
| JP | 2018-137160 | A | | 8/2018 | |
| KR | 10-2013-0026503 | A | | 3/2013 | |
| KR | 10-2019-0085044 | A | | 7/2019 | |
| WO | WO-2015186202 | A1 | * | 12/2015 | ............. H01J 37/28 |
| WO | WO 2017/130364 | A1 | | 8/2017 | |
| WO | WO 2019/131410 | A1 | | 7/2019 | |

OTHER PUBLICATIONS

International Search Report (PCT/ISA/210) issued in PCT Application No. PCT/JP2021/039460 dated Dec. 14, 2021 with English translation (10 pages).

Japanese-language Written Opinion (PCT/ISA/237) issued in PCT Application No. PCT/JP2021/039460 dated Dec. 14, 2021 (eight (8) pages).

International Search Report (PCT/ISA/210) issued in PCT Application No. PCT/JP2020/040350 dated Dec. 22, 2020 (three (3) pages).

Japanese-language Written Opinion (PCT/ISA/237) issued in PCT Application No. PCT/JP2020/040350 dated Dec. 22, 2020 (three (3) pages).

* cited by examiner

[FIG. 1]
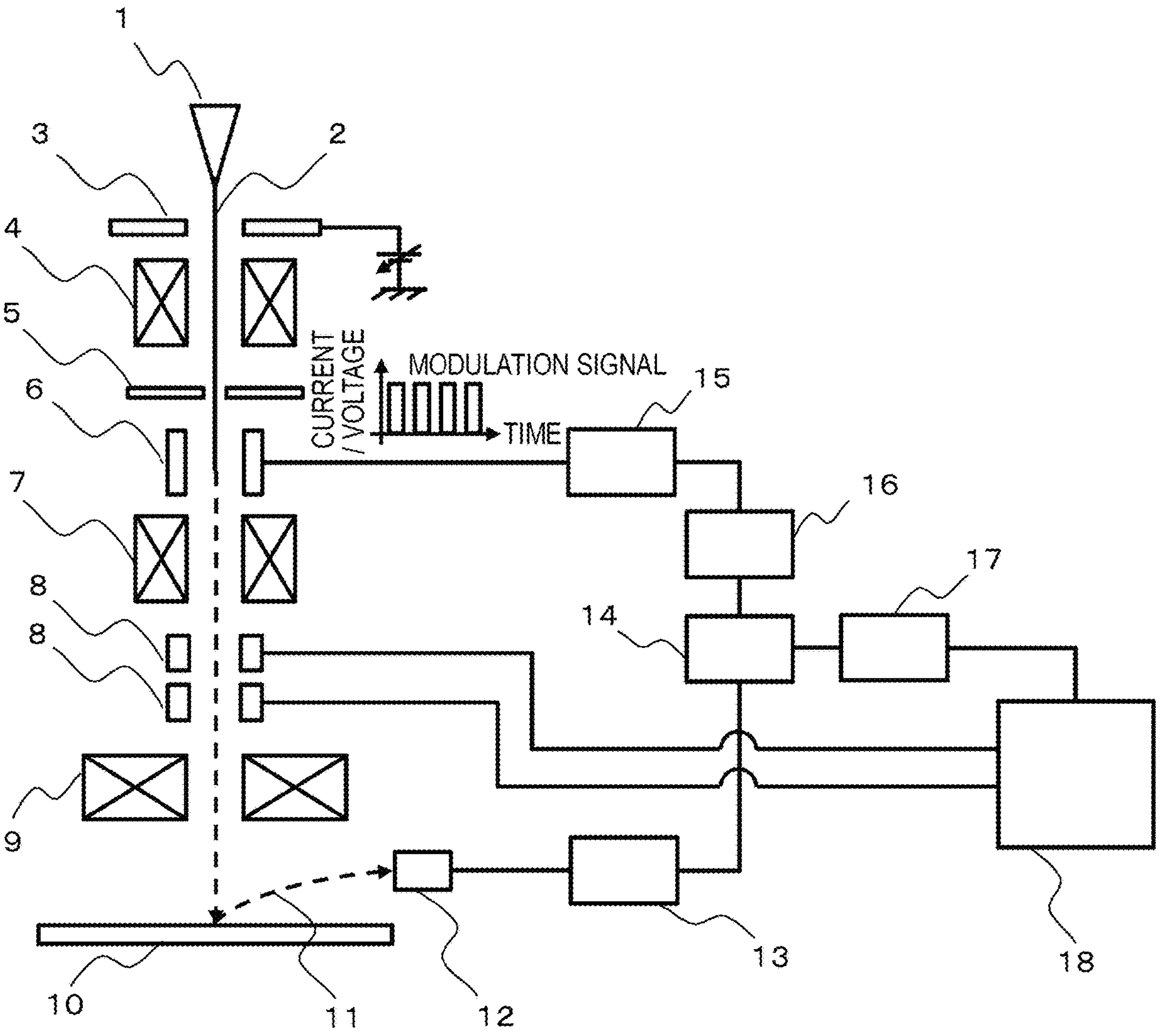

[FIG. 2]
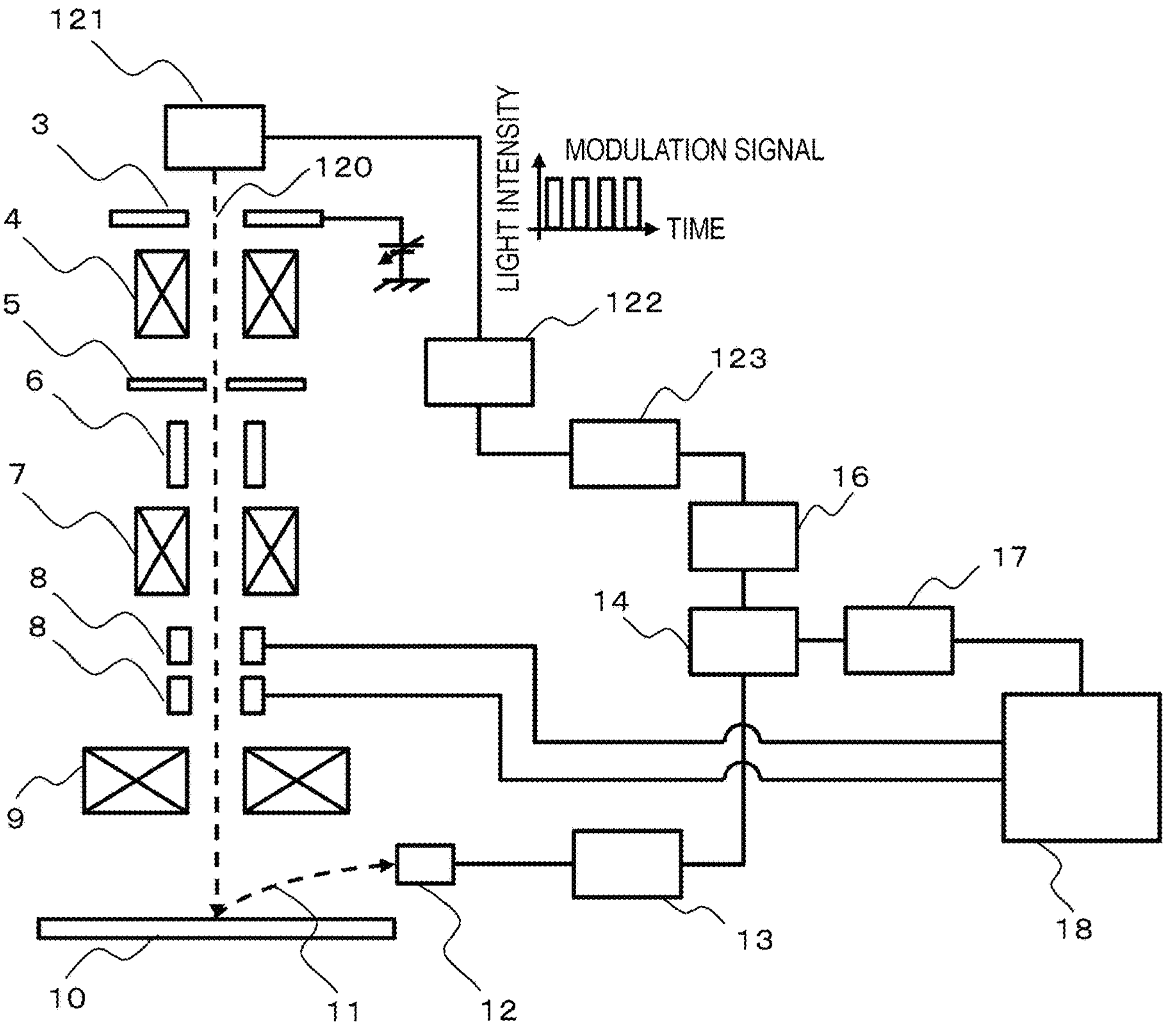

[FIG. 3]
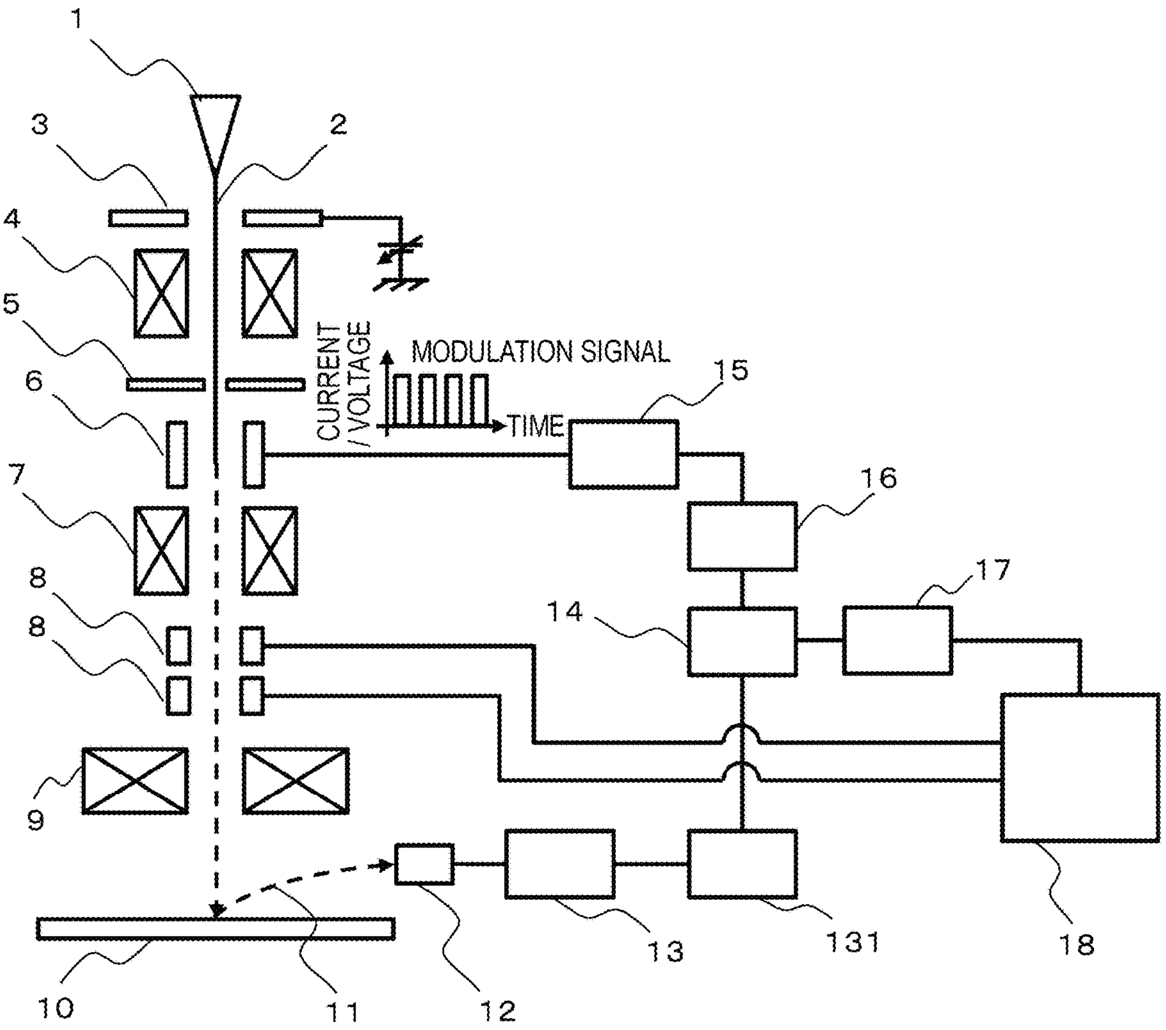

[FIG. 4]
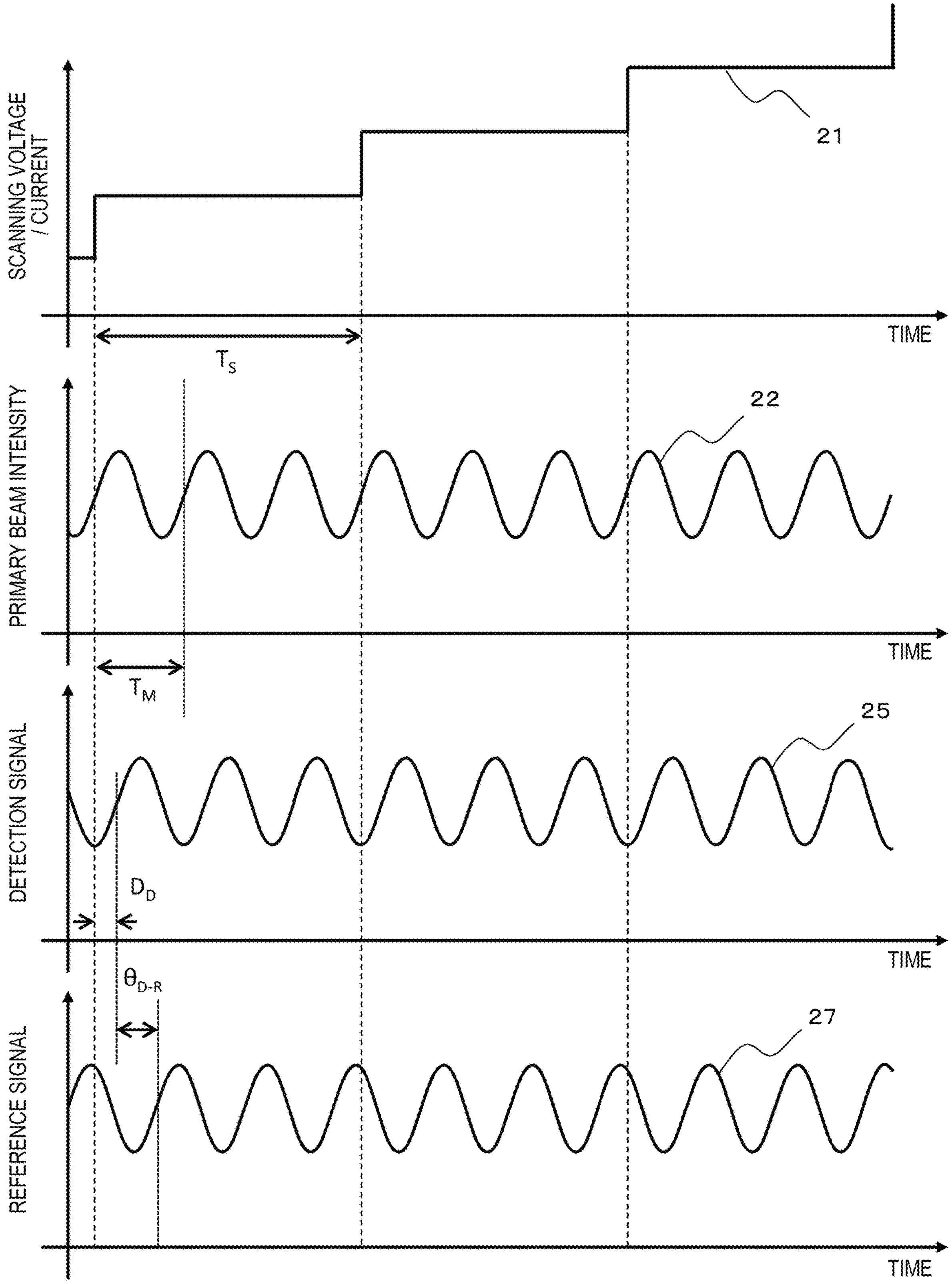

[FIG. 5]
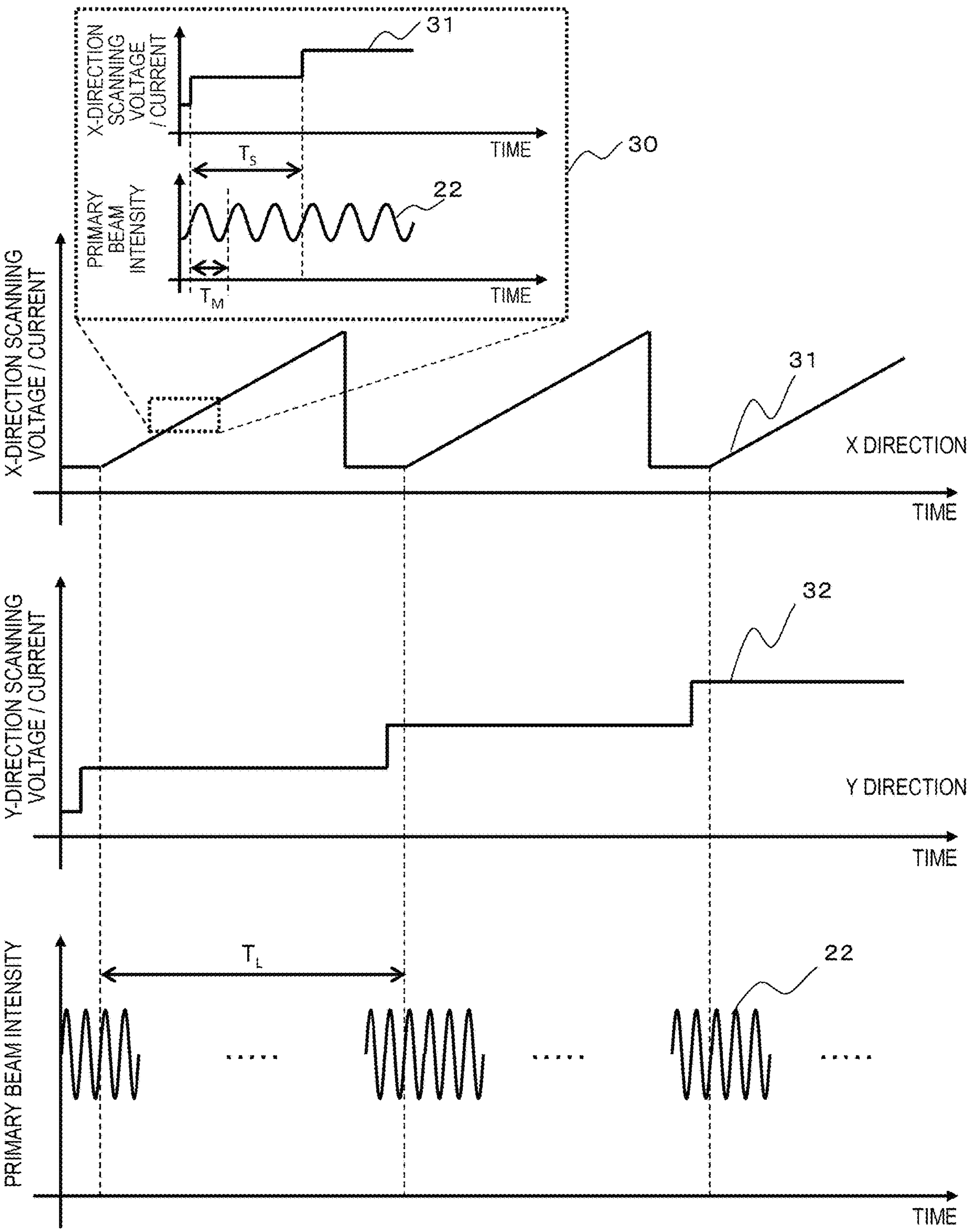

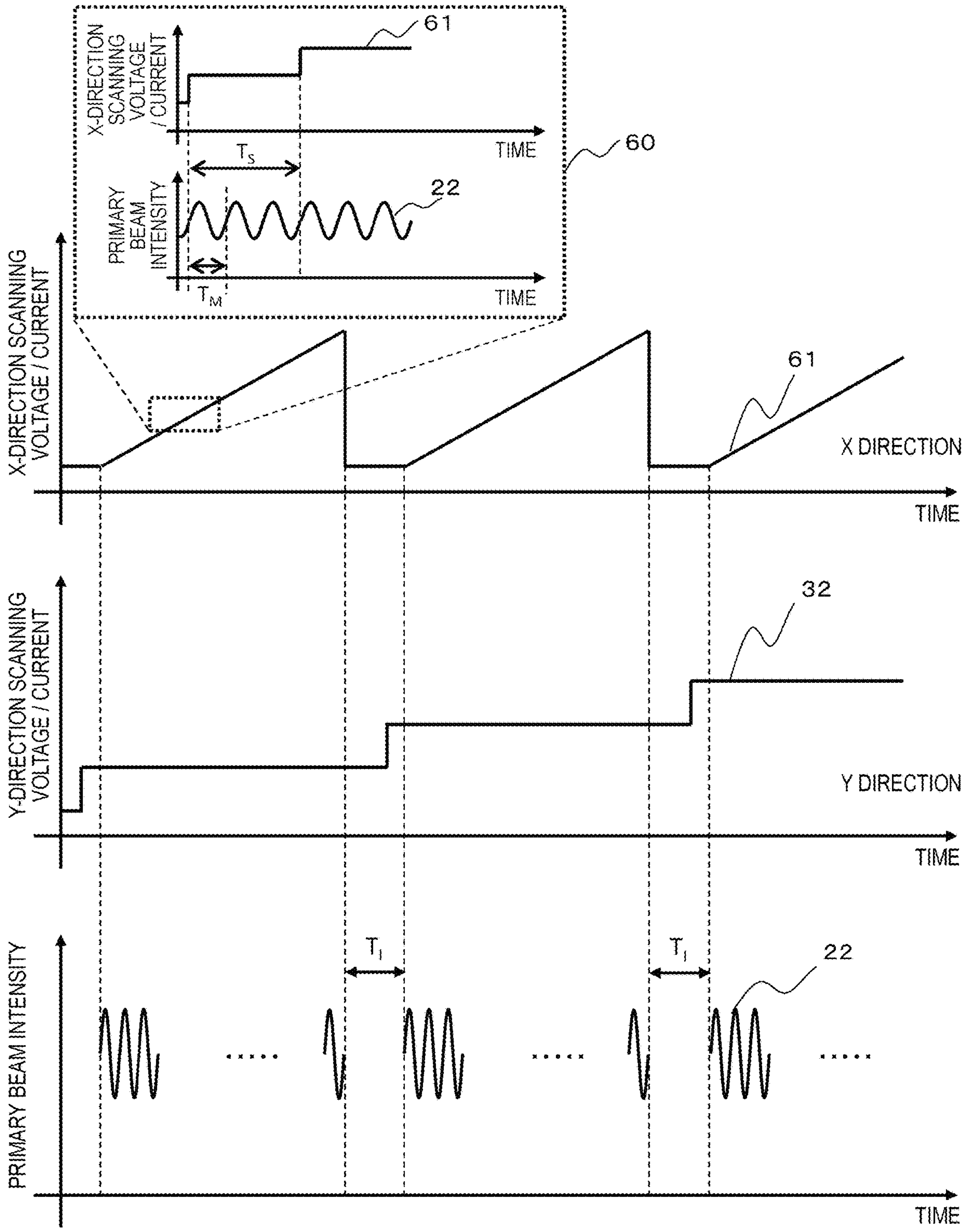
[FIG. 6]
X-DIRECTION SCANNING VOLTAGE / CURRENT
61
TIME
60
$T_S$
PRIMARY BEAM INTENSITY
22
$T_M$
TIME
X-DIRECTION SCANNING VOLTAGE / CURRENT
61
X DIRECTION
TIME
Y-DIRECTION SCANNING VOLTAGE / CURRENT
32
Y DIRECTION
TIME
PRIMARY BEAM INTENSITY
$T_I$
$T_I$
22
TIME

[FIG. 7]
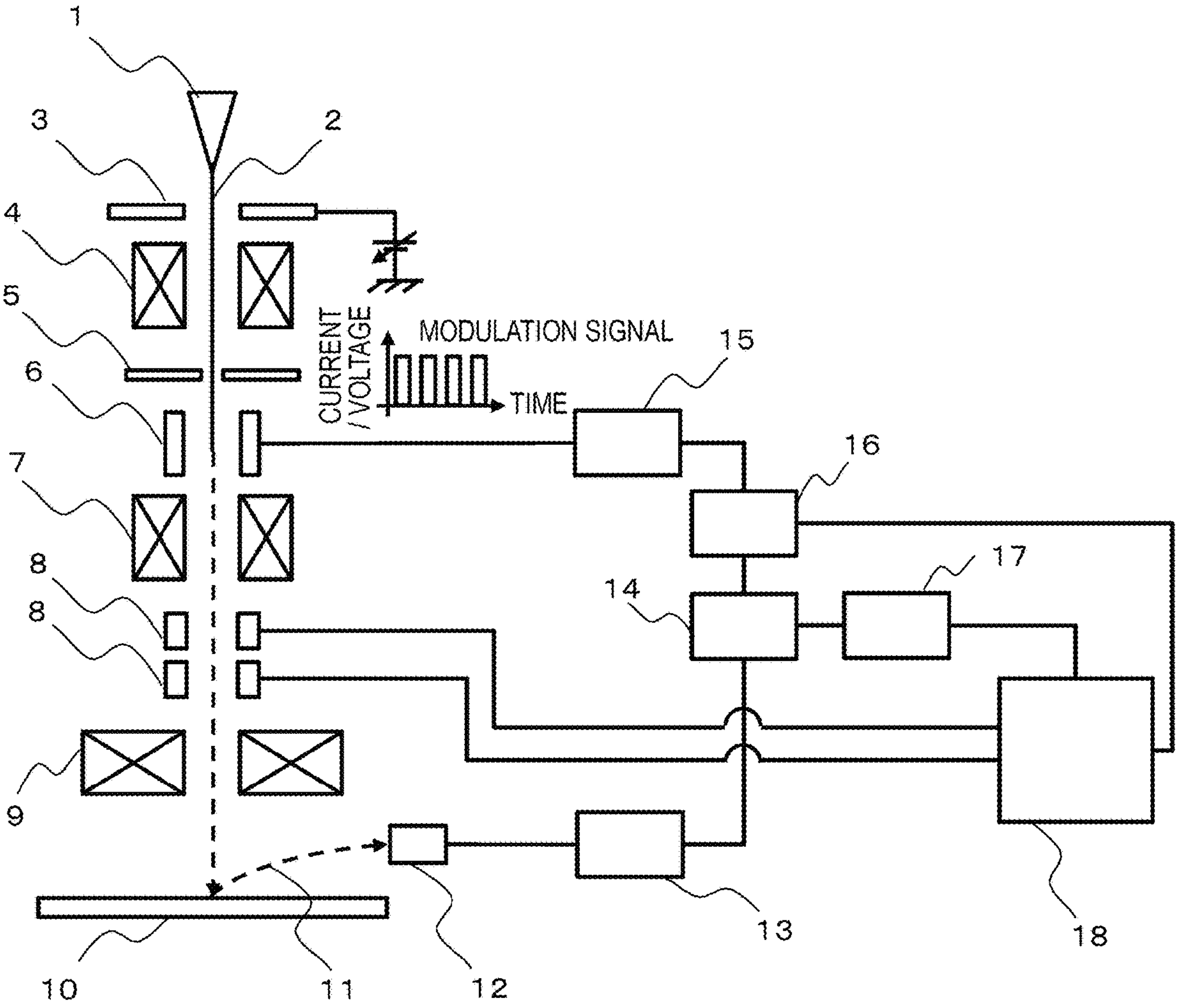

[FIG. 8]
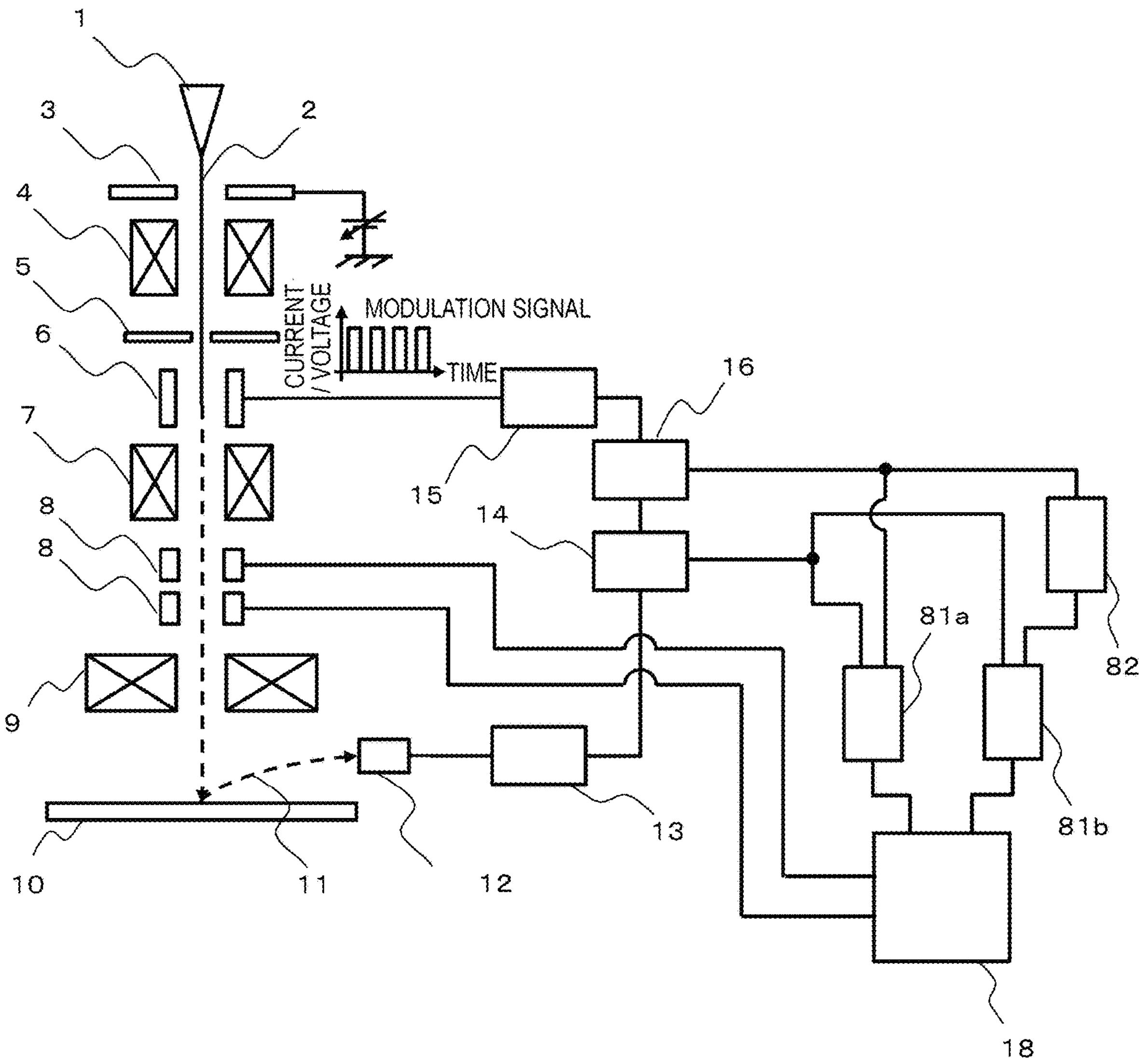

[FIG. 9]
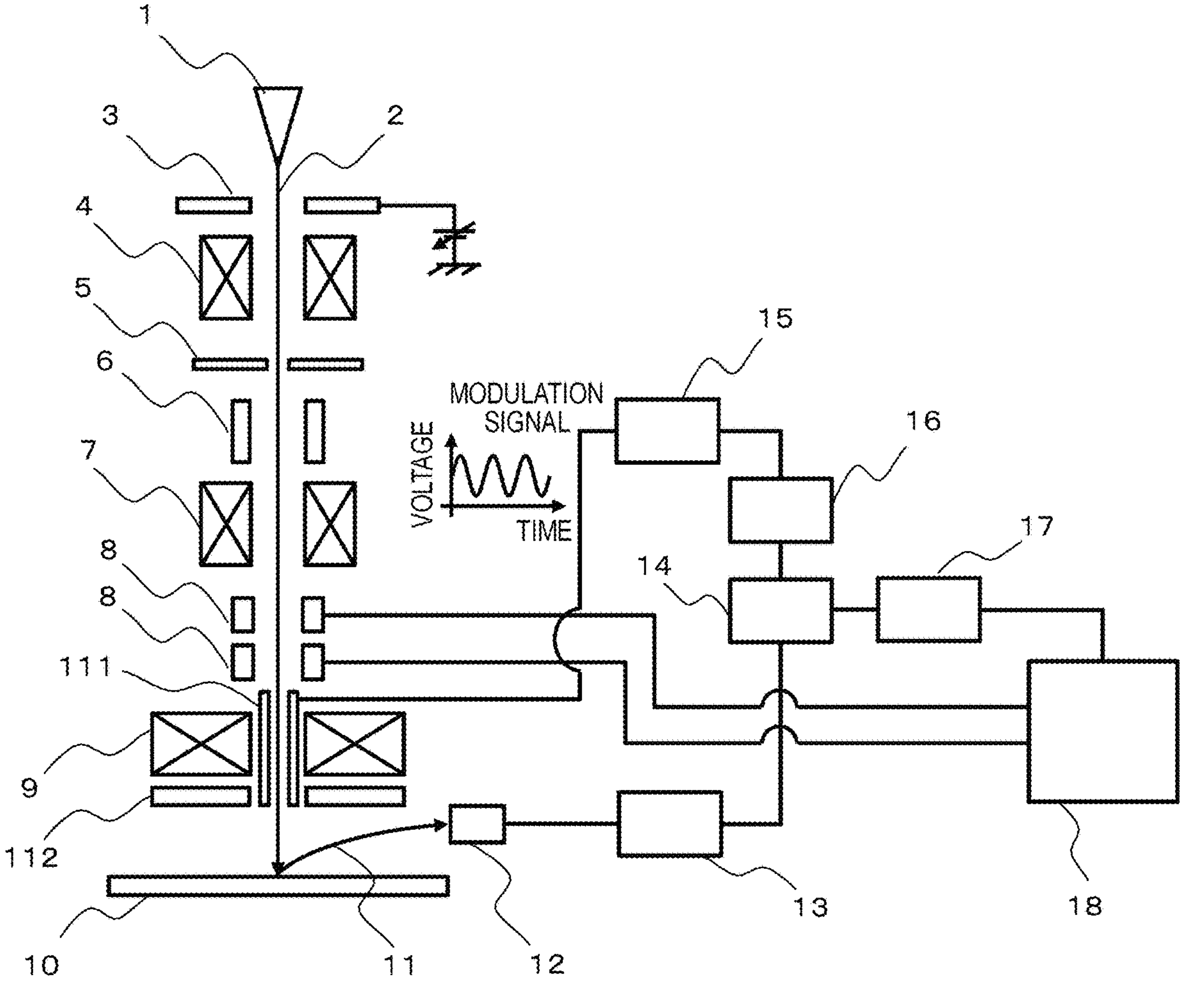

[FIG. 10A]
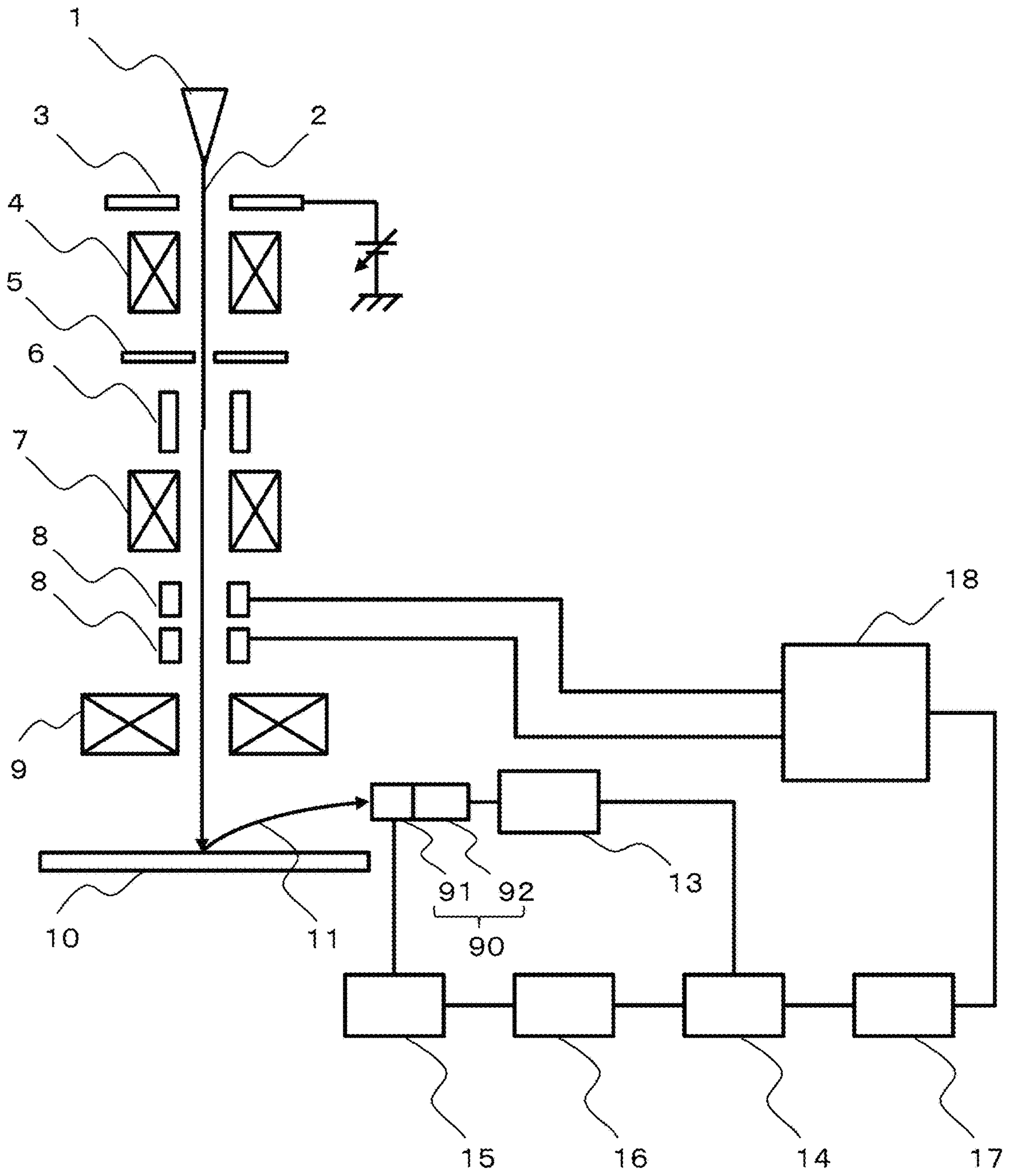

[FIG. 10B]
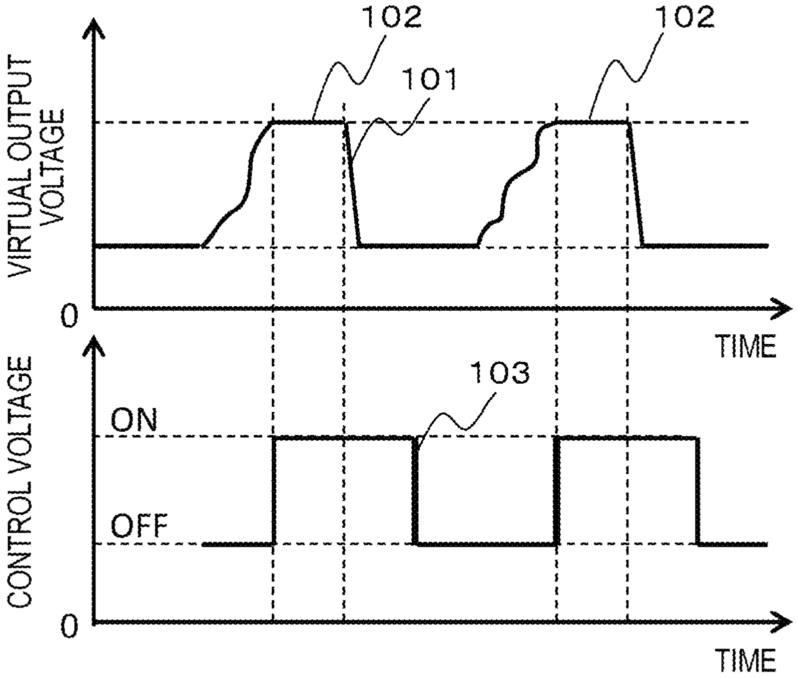

[FIG. 11]
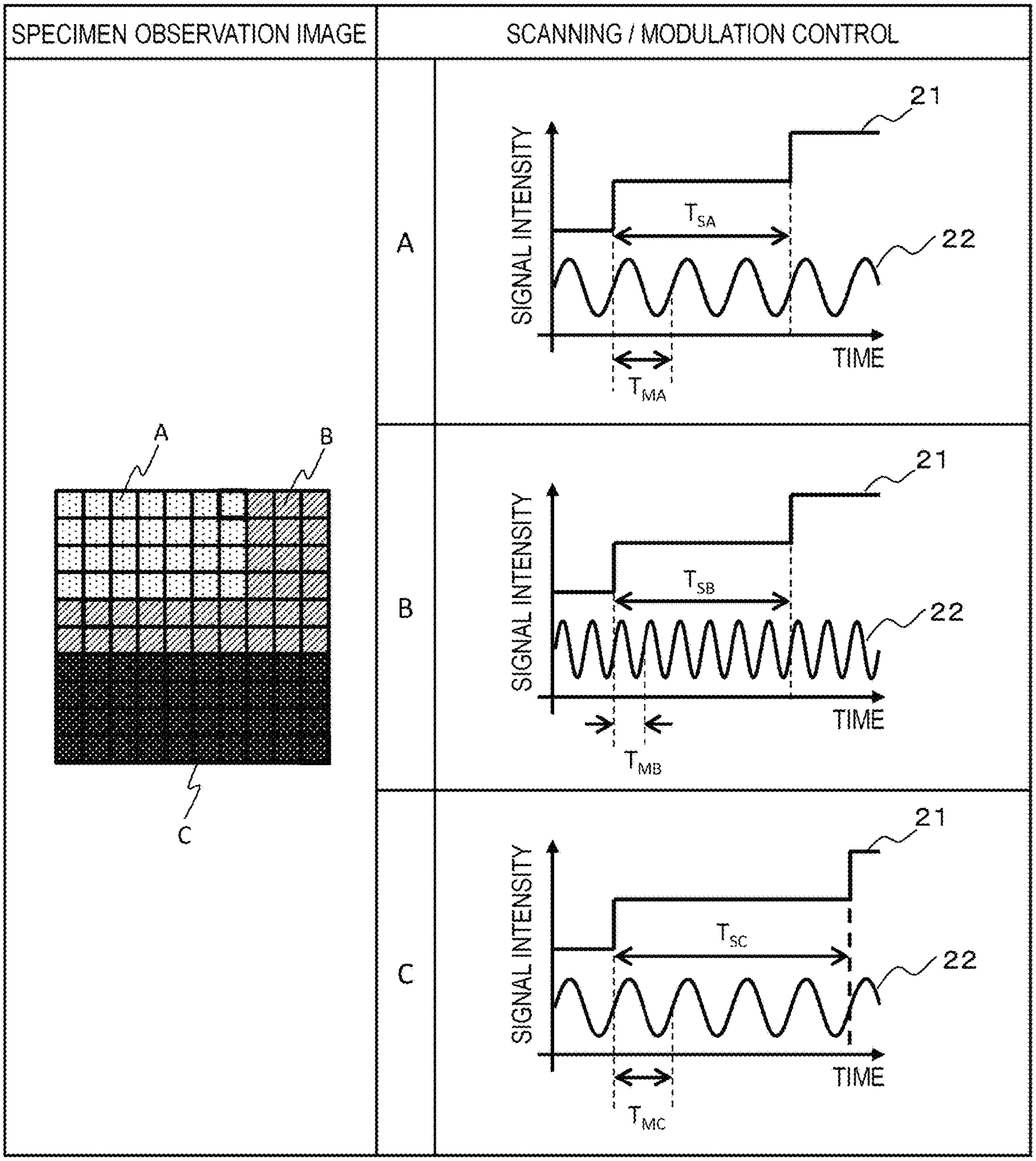

[FIG. 12]
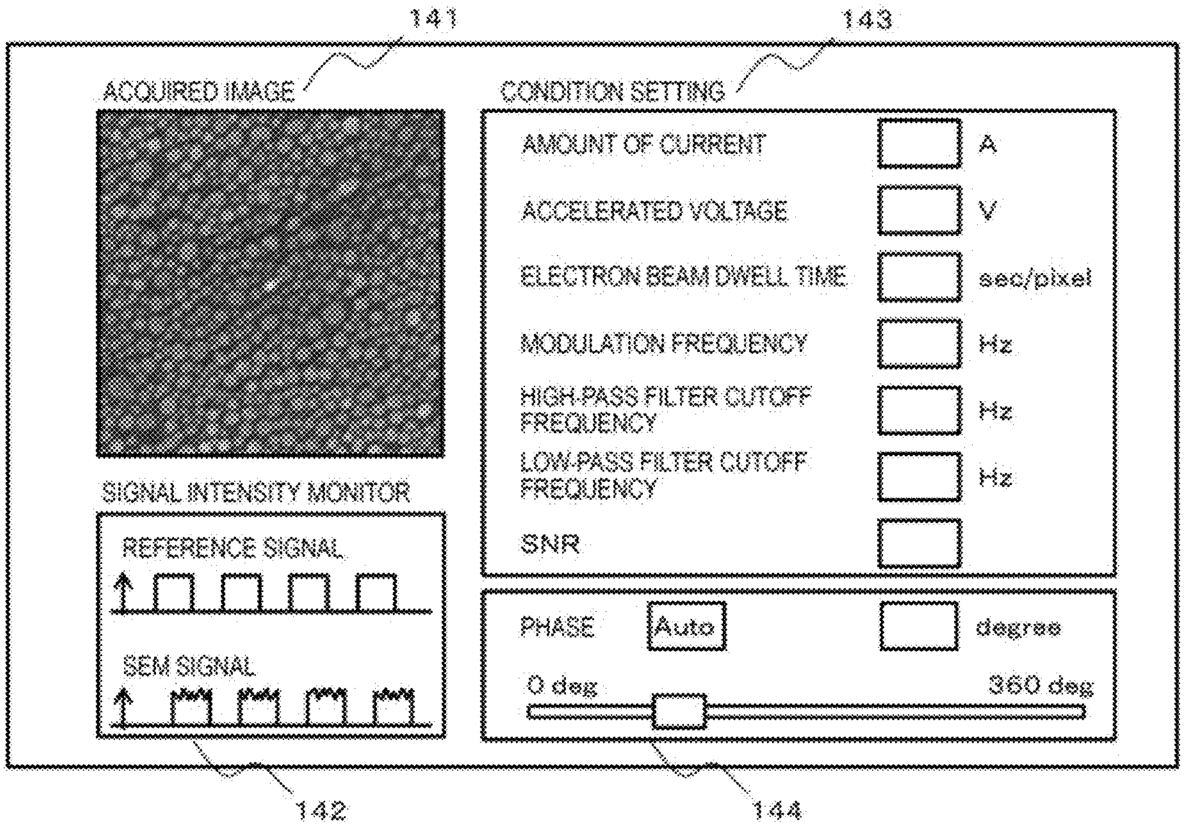

[FIG. 13]
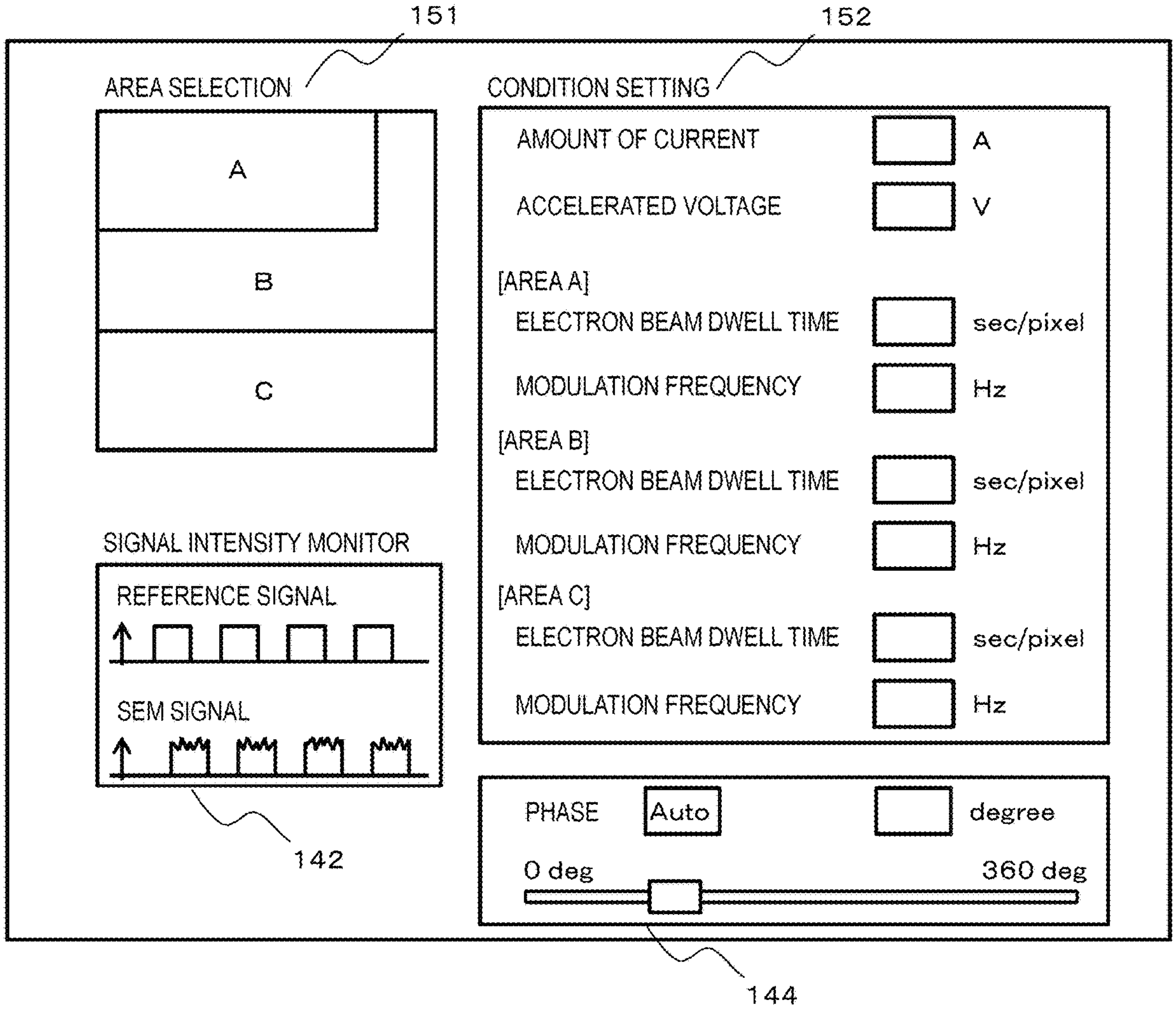

[FIG. 14]
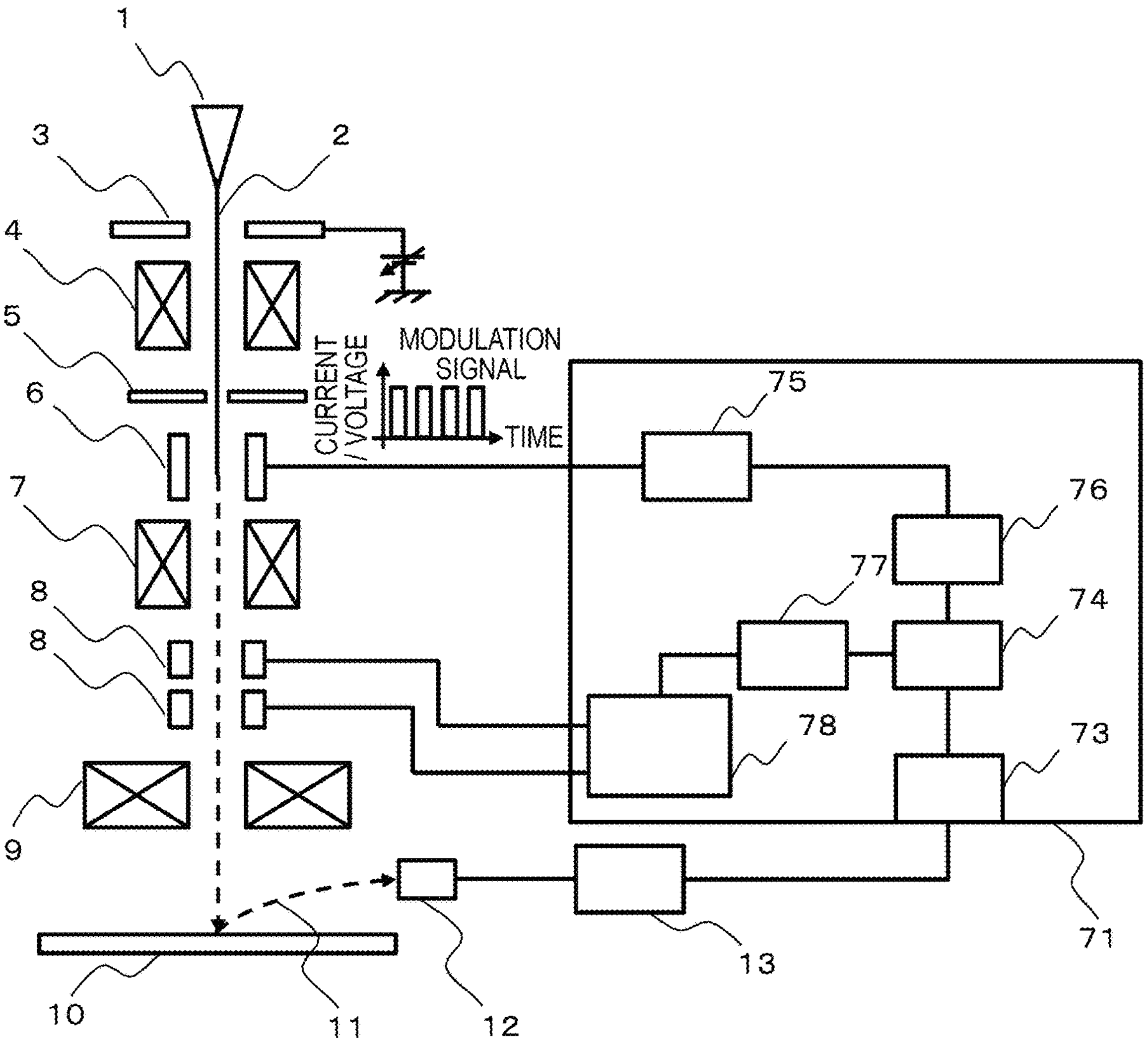

[FIG. 15]
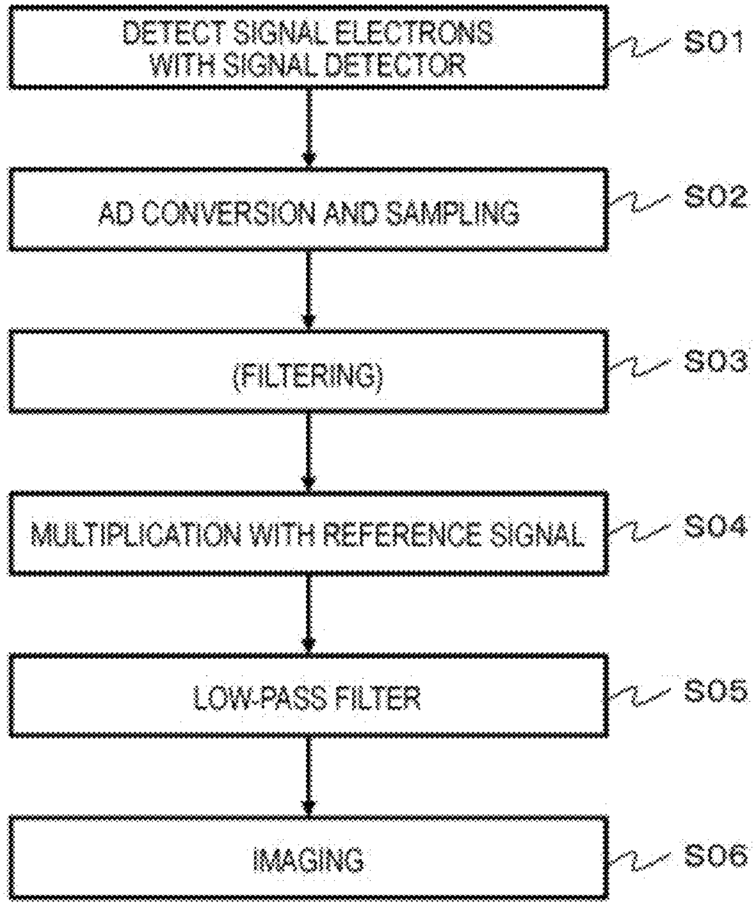

[FIG. 16]
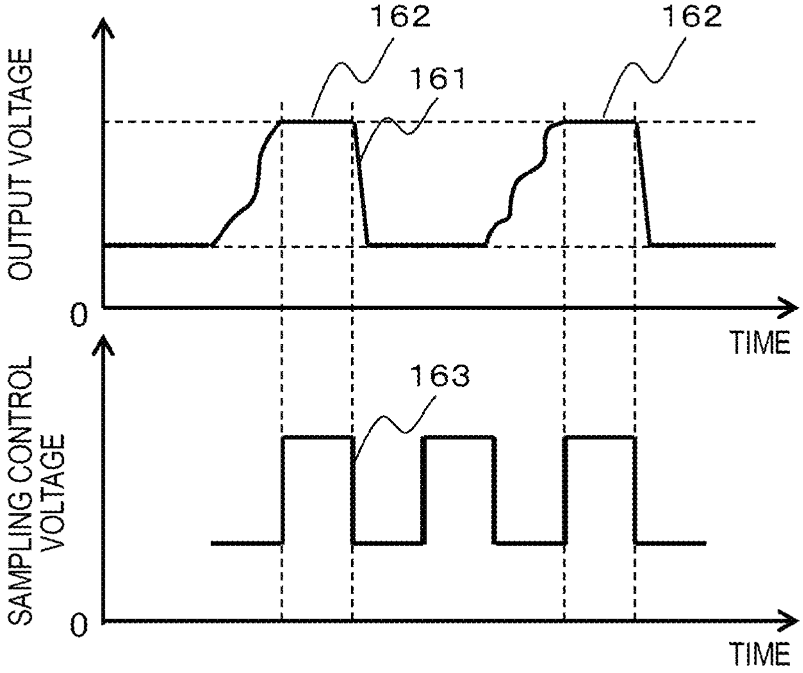

CHARGED PARTICLE BEAM DEVICE AND SPECIMEN OBSERVATION METHOD

TECHNICAL FIELD

The present disclosure relates to a charged particle beam device and a specimen observation method using the charged particle beam device.

BACKGROUND ART

Examples of a scanning charged particle beam device include a scanning electron microscope (SEM). In the SEM, electrons extracted from an electron source are focused on a specimen by a lens, the amount of backscattered electrons generated in the vicinity of the specimen surface or the amount of secondary electrons generated in the specimen are detected to generate an observation image of the specimen. The backscattered electrons or the secondary electrons emitted from the specimen are directly detected by an electron multiplier, or are converted into light by a light emitter (scintillator), and the converted light is detected by a photodetector such as a photomultiplier tube, a CCD, or a CMOS. In the latter detection method, the amount of light emitted from the scintillator per irradiation position of an electron beam corresponds to the amount of backscattered electrons or the amount of secondary electrons, and the brightness of a pixel is determined depending on the amount of light at each of irradiation positions in a two-dimensional plane such that a SEM image can be formed.

One of the application fields of the SEM is defect inspection or dimensional control of a semiconductor pattern, and in recent years, throughput is important as a tool performance of the SEM used in these fields. In recent semiconductor manufacturing, the pattern size has been reduced to several nanometers due to exposure using extreme ultraviolet light, and the pattern density per unit area has increased every year. Therefore, due to the inspection of the pattern or an increase in the number of measurement points, about several days to several tens of days may be required at an inspection and measurement speed in the related art. Therefore, it is desired to significantly increase the throughput of inspection and measurement of the semiconductor pattern by the SEM. Further, in addition to improving the throughput, in order to prevent damage or deformation to the specimen by the electron beam irradiation, it is desired to minimize the amount of an irradiation current as far as possible, and it is necessary to maintain the spatial resolution for observing the fine pattern at the current level.

JP2018-137160A (PTL 1) discloses an electron microscope that irradiates a specimen with a pulsed electron beam. JP2016-189332A (PTL 2) discloses a charged particle beam device that removes an output not generated by irradiation with a charged particle beam, that is, noise by modulating irradiation conditions of the charged particle beam and detecting only a signal that matches a modulation period. JPH05-275045A (PTL 3) discloses that a change in the amount of backscattered electron generated is extracted as a DC signal by irradiating a specimen with an electron beam while changing incident electron energy such that the output from a backscattered electron detector is detected and rectified in synchronization with the change in the incident electron energy.

CITATION LIST

Patent Literature

PTL 1: JP2018-137160A
PTL 2: JP2016-189332A
PTL 3: JPH05-275045A

SUMMARY OF INVENTION

Technical Problem

When the amount of an irradiation current decreases, in general, the signal-to-noise ratio (SNR) of an image decreases, and only an unclear image is obtained. In this case, as a general method, the SNR can be improved by scanning the same position multiple times and integrating signals obtained from each of positions. However, the method of scanning the same position multiple times and integrating the signals to improve the SNR leads to a decrease in throughput. On the other hand, a method that is generally adopted to reduce the number of times of integration is to increase the amount of the irradiation current. However, in this method, damage or deformation to the fine pattern on the specimen may occur due to irradiation with an electron beam as described above. Examples of the damage include specimen deformation or fracture caused by heat, a chemical reaction or charging due to high-energy charged particle irradiation. Further, an increase in the amount of the irradiation current leads to a decrease in spatial resolution. The reason for this is that, by increasing the amount of the irradiation current, the energy width of a charged particle beam increases due to the space charge effect and a charged particle optical system deviates from optimum conditions due to an increase in the focusing angle of the charged particle beam such that aberration increases.

This way, a trade-off relationship is present between three basic performances of the SEM including the throughput, the SNR, and the spatial resolution, and it is difficult to improve the three performances with the SEM in the related art at the same time.

The electron microscope disclosed in PTL 1 is common to one embodiment of the present disclosure in that a specimen is irradiated with a pulsed electron beam. However, PTL 1 aims to increase the accuracy of a voltage contrast image of the specimen and, unlike the present disclosure, does not aim to improve the three basic performances of the SEM including the throughput, the SNR, and the spatial resolution at the same time.

Further, PTL 2 and PTL 3 are common to the present disclosure in that synchronous detection is applied to remove noise. However, when there is a variation in phase difference between signals on which synchronous detection is performed or a variation in phase difference between a detection signal and a sampling signal during digital sampling of the detection signal from a detector, the variation in phase difference generates noise such that the three basic performances of the SEM cannot be sufficiently improved.

Solution to Problem

A charged particle beam device according to one embodiment of the present disclosure includes: a charged particle optical system including a charged particle source, one or more lenses configured to focus a charged particle beam from the charged particle source on a specimen, and a deflector configured to deflect the charged particle beam to scan the specimen; a detection system including a detector configured to detect signal charged particles or an electromagnetic wave emitted by irradiating the specimen with the charged particle beam; and a computer configured to control the charged particle optical system to scan the specimen with the charged particle beam and to generate an image or a signal profile based on a detection signal output from the detector when the detector detects signal charged particles or an electromagnetic wave emitted by irradiating an irradiation position corresponding to one pixel with the charged particle beam, in which the computer controls at least one of the charged particle optical system or the detection system so as to modulate an intensity of the signal charged particles or the electromagnetic wave detected by the detector at a predetermined frequency, and generates the image or the signal profile by associating an irradiation position of the charged particle beam with a DC component of a signal acquired through synchronous detection of a detection signal from the detector at the irradiation position with a reference signal having the predetermined frequency, and the computer controls a phase difference between the detection signal from the detector and the reference signal for the synchronous detection to be fixed irrespective of the irradiation position of the charged particle beam.

A charged particle beam device according to another embodiment of the present disclosure includes: a charged particle optical system including a charged particle source, one or more lenses configured to focus a charged particle beam from the charged particle source on a specimen, and a deflector configured to deflect the charged particle beam to scan the specimen; a detection system including a detector configured to detect signal charged particles or an electromagnetic wave emitted by irradiating the specimen with the charged particle beam; and a computer configured to control the charged particle optical system to scan the specimen with the charged particle beam and to generate an image or a signal profile based on a detection signal output from the detector when the detector detects signal charged particles or an electromagnetic wave emitted by irradiating an irradiation position corresponding to one pixel with the charged particle beam, in which the computer controls at least one of the charged particle optical system or the detection system so as to modulate an intensity of the signal charged particles or the electromagnetic wave detected by the detector at a predetermined frequency, and generates the image or the signal profile by associating an irradiation position of the charged particle beam with a DC component of a signal acquired through synchronous detection of a detection signal from the detector at the irradiation position with a reference signal having the predetermined frequency, and the computer converts the detection signal from the detector into a digital signal and takes in the digital signal based on a sampling signal, sets a frequency of the sampling signal to be two times or more of a modulation frequency of the intensity of the signal charged particles or the electromagnetic wave detected by the detector, and executes a control such that the modulation of the intensity of the signal charged particles and the electromagnetic wave detected by the detector and the sampling signal are synchronized with a predetermined phase difference.

Advantageous Effects of Invention

The present disclosure overcomes a trade-off between throughput, SNR, and spatial resolution in a charged particle beam device.

Other objects and new characteristics will be clarified with reference to description of the specification and the accompanying drawings.

BRIEF DESCRIPTION OF DRAWINGS

FIG. 1 is a diagram illustrating a basic configuration of a frequency modulation SEM.

FIG. 2 is a diagram illustrating a basic configuration of the frequency modulation SEM using a photo-excitation electron source.

FIG. 3 is a diagram illustrating a configuration of the frequency modulation SEM on which a high-pass filter is mounted.

FIG. 4 is a diagram illustrating a relationship between a scanning signal and a modulation period of a primary beam intensity during one-dimensional scanning.

FIG. 5 is a diagram illustrating a relationship between a scanning signal and a modulation period of a primary beam intensity during two-dimensional scanning.

FIG. 6 is a diagram illustrating a relationship between a scanning signal and a modulation period of a primary beam intensity during two-dimensional scanning.

FIG. 7 is a diagram illustrating a configuration of a frequency modulation SEM according to a second modification example.

FIG. 8 is a diagram illustrating a configuration of a frequency modulation SEM according to a third modification example.

FIG. 9 is a diagram illustrating a configuration of a frequency modulation SEM according to a fourth modification example.

FIG. 10A is a diagram illustrating a configuration of a frequency modulation SEM according to a fifth modification example.

FIG. 10B is a diagram illustrating an effect when both of modulation of an electron optical system and modulation of a detection system are performed.

FIG. 11 is a diagram illustrating a relationship between a scanning signal and a modulation period of a primary beam intensity when a primary beam dwell time or a beam modulation period is set to vary depending on areas.

FIG. 12 illustrates an example of an operation screen.

FIG. 13 illustrates an example of the operation screen.

FIG. 14 is a diagram illustrating a basic configuration of a digital frequency modulation SEM.

FIG. 15 is a diagram illustrating an acquisition flow of a detection signal in the digital frequency modulation SEM.

FIG. 16 is a diagram illustrating a relationship between a detection signal and a sampling signal.

DESCRIPTION OF EMBODIMENTS

An electron microscope (frequency modulation SEM) will be described as an example of a charged particle beam device according to the present disclosure.

First Embodiment

FIG. 1 illustrates a basic device configuration of an electron microscope (frequency modulation SEM) according to the present embodiment. FIG. 1 illustrates an electron optical system, a detection system, and a control system as the basic configuration of the electron microscope. The electron optical system includes an electron emission unit 1, an acceleration electrode 3, focusing lenses 4 and 7, an aperture 5, a chopper 6, a deflector 8, an objective lens 9, and a signal generator 15. The detection system includes a signal detector 12, an amplifier 13, a phase-sensitive detector 14, a phase adjuster 16, and a low-pass filter 17. The control system includes a computer 18.

A primary beam 2 emitted from the electron emission unit 1 is accelerated by the acceleration electrode 3 and is focused by the focusing lens 4. Regarding the primary beam 2, the amount of a current is adjusted by the aperture 5, and then the beam intensity per unit area on a specimen is frequency-modulated by the chopper 6. In this example, the primary beam 2 is modulated based on a deflection voltage (control signal) of a square wave from the signal generator 15. The chopper 6 can be configured using a blanking deflector having an aperture, and the beam intensity is modulated (the primary beam 2 is pulsed) by controlling whether or not to allow the primary beam 2 to pass through the aperture depending on the deflection amount of the deflector. The chopper 6 is disposed at a cross position of the primary beam by the focusing lens 4 (an object point position of the lower focusing lens 7) such that noise generated by modulation can be reduced.

The frequency-modulated primary beam 2 is then focused by the focusing lens 7, passes through the objective lens 9, and is emitted to a specimen 10. In addition, the deflector 8 is disposed between the focusing lens 7 and the objective lens 9 and deflects the primary beam 2 to scan the specimen 10. The size or material of the specimen 10 is not limited. For example, the specimen 10 may be a semiconductor wafer. By irradiating the specimen 10 with the primary beam 2, signal electrons 11 are emitted due to an interaction between the primary beam 2 and the specimen 10. The signal electrons 11 are detected by the signal detector 12. The beam intensity of the primary beam 2 is frequency-modulated such that the intensity of the signal electrons 11 detected by the signal detector 12 is also frequency-modulated. A detection signal from the signal detector 12 is amplified by the amplifier 13 and then input to the phase-sensitive detector 14. Examples of the signal detector 12 include an E-T detector. In the E-T detector, the signal electrons can be efficiently detected using a scintillator and a photomultiplier tube.

A reference signal having the same period as the deflection voltage for modulating the primary beam 2 is also input from the signal generator 15 to the phase-sensitive detector 14. This reference signal is transmitted from the signal generator 15, the phase of the reference signal is adjusted by the phase adjuster 16, and then the reference signal is input to the phase-sensitive detector 14. FIG. 1 illustrates the example where the signal generator 15 is shared for the beam intensity modulation and the reference signal transmission. A plurality of signal generators 15 may be provided to be used separately for the beam intensity modulation and the reference signal transmission.

In the phase-sensitive detector 14, multiplication (synchronous detection, phase detection) is performed using the two signals including the detection signal from the signal detector 12 and the reference signal from the signal generator 15. By performing the synchronous detection, the signal can be detected with a high SNR. FIG. 1 illustrates the example where the primary beam 2 is modulated (pulsed) with a square wave. Hereinafter, for simplification of description, a case where the primary beam 2 is modulated with a sine wave will be described as an example. The square wave is expressed by overlaying sine waves, and thus the same can be applied to the case of the square wave.

The detection signal is represented by A $\sin(\omega_s t+\theta_s)$, the reference signal is represented by $\sin(\omega_r t+\theta_r)$, and the noise is represented by $N(\omega)\sin(\omega t)$. Here, the noise is mainly noise that is superimposed on the detection signal in the signal detector 12 or the amplifier 13. A represents the amplitude of the detection signal with respect to 1 that is the amplitude of the reference signal, $\omega_s$ represents the frequency of the detection signal, $\theta_s$ represents the phase of the detection signal, t represents the time, $\omega_r$ represents the frequency of the reference signal, $\theta_r$ represents the phase of the reference signal, $N(\omega)$ represents the amplitude of the noise, and w represents the frequency of the noise. The amplitude of the noise has frequency dependence and thus is represented by a function of the frequency ω.

In the phase-sensitive detector 14, the detection signal and the reference signal to which the noise is added are multiplied by each other, and an output signal S of the phase-sensitive detector 14 is represented by (Expression 1).

[Expression 1]

$$S=\left\{A\sin(\omega_s t+\theta_s)+\int N(\omega)\sin(\omega t)d\omega\right\}\times\sin(\omega_r t+\theta_r)= A\ \sin(\omega_s t+\theta_s)\sin(\omega_r t+\theta_r)+\int N(\omega)\sin(\omega t)\sin(\omega_r t+\theta_r)d\omega= A/2\times\cos\{(\omega_s t+\theta_s)-(\omega_r t+\theta_s)\}-A/2\times\cos\{(\omega_s t+\theta_s)+(\omega_r t+\theta_r)\}+\int N(\omega)\sin(\omega t)\sin(\omega_r t+\theta_r)d\omega$$

The product of the detection signal and the reference signal to which the noise is added can be modified as in (Expression 1) using a trigonometric identity. Here, the frequencies of the detection signal and the reference signal are the same and thus can be represented by $\omega_s=\omega_r$. Therefore, (Expression 1) can be modified into (Expression 2).

[Expression 2]

$$S=A/2\times\cos(\theta_s-\theta_r)-A/2\times\cos(2\omega_s t+\theta_s+\theta_r)+\int N(\omega)\sin(\omega t)\sin(\omega_r t+\theta_r)d\omega$$

In addition, the third term in (Expression 2) can also be modified as in (Expression 3) using a trigonometric identity.

[Expression 3]

$$\int N(\omega)\sin(\omega t)\sin(\omega_r t+\theta_r)d\omega=\int[1/2\times N(\omega)\cos\{\omega t-(\omega_r t+\theta_r)\}-1/2\times N(\omega)\cos[\omega t+(\omega_r t=\theta_r)\}]d\omega$$

The output signal S of the phase-sensitive detector 14 is input to the low-pass filter 17, and a DC component $S_{DC}$ thereof is extracted. In (Expression 3), the DC component in the third term of (Expression 2) is $\omega=\omega_r$. Therefore, when dω represents the bandwidth, the DC component $S_{DC}$ is represented by (Expression 4).

[Expression 4]

$$S_{DC}=A/2\times\cos(\theta_s-\theta_r)+1/2\times N(\omega_r)\cos(\theta_r)d\omega$$

In (Expression 4), when the phase $\theta_s$ of the detection signal and the phase $\theta_r$ of the reference signal are matched to each other, the first term is A/2, and the noise remaining as the second term is only the noise component of the frequency $\omega_r$. Accordingly, the frequency $\omega_r$ of the reference signal, that is, the modulation frequency of the primary beam 2 is set to a frequency band having a low noise (for example, a high frequency band in the E-T detector), and the reference signal of which the phase $\theta_r$ is adjusted to match the phase $\theta_s$ of the detection signal by the phase adjuster 16 is input to the phase-sensitive detector 14, so that the amplitude A of the detection signal can be acquired with a high SNR.

In the computer 18, the DC component $S_{DC}$ is extracted from the low-pass filter 17 and is associated with the irradiation position of the primary beam 2 on the specimen (corresponding to a pixel position of an image or a signal profile) to form a SEM image or a signal profile. This way, the detection signal can be obtained with a high SNR. Therefore, a signal acquisition interval (sampling time) of the output signal of the low-pass filter 17 in the computer 18 may be set irrespective of the modulation frequency of the signal generator 15, and data may be acquired once for each pixel.

FIG. 2 illustrates a device configuration of an electron microscope where a photo-excitation electron source is used as the electron emission unit. The same components as those of the configuration of FIG. 1 are represented by the same reference numerals, and the description thereof will not be repeated. In this configuration, the photo-excitation electron source is used. Therefore, a pulsed laser 122 is added to the electron optical system, and a photodetector 123 is added to the detection system. Pulsed light output from the pulsed laser 122 is incident on a photo-excitation electron source 121, and a pulsed primary beam 120 is emitted. On the other hand, the light from the pulsed laser 122 is branched, and the photodetector 123 detects the branched light. With the above-described configuration, the detection signal of the light from the pulsed laser 122 that is detected by the photodetector 123 can be used as the reference signal that is modulated at the same frequency as the modulation frequency of the pulsed primary beam 120. A photodetector or a photomultiplier tube may be used as the photodetector 123.

The detection signal of the signal electrons 11 generated from the specimen 10 by irradiation with the pulsed primary beam 120 is input to the phase-sensitive detector 14 and is processed as in the device configuration of FIG. 1 in the detection system. The pulsed laser 122 that outputs the pulsed light may be configured using the signal generator that generates a frequency signal. In the frequency signal, any waveform such as a square wave or a sine wave may be used. In this case, as in the configuration of FIG. 1, a configuration where the frequency signal output from the signal generator is input to the phase adjuster 16 as the reference signal may also be adopted.

FIG. 3 illustrates an example where a high-pass filter 131 is disposed as a modification example of the device configuration of FIG. 1. In the detection system, noise positioned in a low frequency band can be cut by disposing the high-pass filter 131 in a rear stage of the amplifier 13. The noise that is superimposed on the detection signal in the signal detector 12 or the amplifier 13 is relatively large in the low frequency band. In the present embodiment, the primary beam 2, that is, the signal electrons 11 are modulated such that the noise that is relatively large in the low frequency band can be removed without adversely affecting the signal component.

FIG. 4 illustrates changes over time of a scanning signal 21, a primary beam intensity 22, a detection signal 25, and a reference signal 27 when a specimen is one-dimensionally (for example, an X direction) scanned with the primary beam 2 to obtain a signal profile. Regarding the scanning signal 21, a scanning voltage or a scanning current (depending on the configuration of the deflector) is changed such that the irradiation position is moved in the X direction at an interval of a primary beam dwell time $T_S$ per pixel. The primary beam intensity 22 shows a change in beam intensity per unit area on the specimen, and the detection signal 25 is also modulated together with the modulation of the primary beam 2. In addition, the reference signal 27 has the same frequency as the modulation frequency of the primary beam 2. FIG. 4 schematically illustrates all of the primary beam intensity 22, the detection signal 25, and the reference signal 27 as the signals modulated at the same frequency. Here, the example where the primary beam 2 is modulated with a sine wave is illustrated. However, the same can be applied to a case where the primary beam 2 is modulated with another waveform such as a square wave.

Regarding a beam modulation period $T_M$ on the specimen indicated in the primary beam intensity 22, the beam modulation period $T_M$ and the primary beam dwell time $T_S$ are adjusted such that the beam modulation period $T_M$ is shorter than the primary beam dwell time $T_S$ per pixel.

The detection signal 25 is input to the phase-sensitive detector 14 in a state where a detection delay $D_D$ from the modulation of the primary beam intensity 22 occurs. The reference signal 27 is also input to the phase-sensitive detector 14, and a phase difference $\theta_{D-R}$ between the reference signal 27 and the detection signal 25 is present. The phase adjuster 16 delays the reference signal to be input to the phase-sensitive detector 14, and inputs the reference signal to the phase-sensitive detector 14 in a state where the phase difference $\theta_{D-R}$ between the detection signal and the reference signal is 0. Accordingly, when the primary beam dwell time $T_S$ is a positive integer multiple of the beam modulation period $T_M$, the phase adjustment amounts by the phase adjuster 16 at the irradiation positions corresponding to respective pixels can be made the same. In addition, since the intensities of electron beams with which respective pixels are irradiated can be made the same, an effect of suppressing a variation in the obtained signal amount or damage can also be obtained.

FIG. 5 illustrates changes over time of the scanning signal and the primary beam intensity 22 when a specimen is two-dimensionally scanned with the primary beam 2 to obtain a SEM image. Here, the example where the specimen is two-dimensionally scanned by raster scanning of repeating the scanning in the X direction (also referred to as "scanning line") while shifting the position in a Y direction perpendicular to the X direction. The raster scanning method is merely exemplary, and the two-dimensional scanning method is not limited to being performed with the scanning signal illustrated in FIG. 5.

During the two-dimensional scanning with the primary beam 2, as illustrated in an enlarged view 30, the primary beam dwell time $T_S$ per pixel is set to be longer than the beam modulation period $T_M$ on the specimen. Due to the same reason as that of the one-dimensional scanning illustrated in FIG. 4, when a period of time from start of X-direction scanning at one position to start of X-direction scanning at a next position is defined as an X-direction scanning period $T_L$, the X-direction scanning period $T_L$ of an X-direction scanning signal 31 is a positive integer multiple of the beam modulation period $T_M$. As a result, the phase difference $\theta_{D-R}$ between the detection signal and the reference signal at the X-direction scanning start position can be maintained to be fixed irrespective of the positions in the Y direction.

As described above, when the primary beam dwell time $T_S$ per pixel is not a positive integer multiple of the beam modulation period $T_M$ and when the X-direction scanning period $T_L$ is not a positive integer multiple of the beam modulation period $T_M$, the phase difference $\theta_{D-R}$ between the detection signal 25 and the reference signal 27 varies depending on the beam irradiation positions. This means that even when the primary beam dwell time $T_S$ where the primary beam 2 is emitted is fixed, the intensity of the primary beam 2 is modulated such that the amount of an irradiation probe current at the irradiation position or the number of electrons in the dwell time varies depending on the irradiation positions. This way, the variation in the phase difference $\theta_{D-R}$ generates a noise component, which leads to deterioration in the SEM image. Accordingly, in order to improve the spatial resolution of the SEM image, it is desirable to control the scanning and the modulation of the primary beam 2 such that the phase difference $\theta_{D-R}$ is fixed at all of the irradiation positions of the primary beam 2.

This way, in the frequency modulation SEM according to the present embodiment, by modulating the primary beam at the frequency in a high frequency band where the noise of the detector is low, the signal component is detected at the modulation frequency where the amount of the signal component is sufficiently more than that of the noise component. Accordingly, an image can be generated with a higher SNR than that of a SEM image in the related art. In the frequency modulation SEM according to the present embodiment, the SNR of the signal is significantly improved. Therefore, the acquisition time of one image can be reduced, which contributes to the improvement of throughput. For example, in the SEM in the related art, in order to improve the SNR of an image, it is necessary to increase the number of times of integration, to increase the primary beam dwell time $T_S$ per pixel, or to increase the amount of a probe current. On the other hand, in the frequency modulation SEM, the detection signal can be obtained with a high SNR even without integrating images or increasing the primary beam dwell time $T_S$. A decrease in the image acquisition time for integration or in the primary beam dwell time $T_S$ leads to the improvement of throughput and a decrease in damage to the specimen. In addition, since it is not necessary to increase the amount of a probe current, there is an advantageous effect in that deterioration in spatial resolution or charging caused by an increase in the amount of a probe current also does not occur. That is, the trade-off between the three performances including throughput, SNR, and spatial resolution can be resolved.

In particular, in the measurement or the inspection of a semiconductor wafer, charge-up of a specimen or damage to a specimen or carbon contamination caused by irradiation with the primary beam is a problem. By reducing the number of irradiation electrons per irradiation position, damage or deformation such as charge-up or shrink, adhesion of carbon contamination, and the like can be significantly reduced. Therefore, more accurate dimensional measurement or improvement of defect detection rate can be achieved.

Various modifications can be made for the frequency modulation SEM according to the present disclosure and will be described below.

First Modification Example

FIG. 6 illustrates a control example different from FIG. 5 for maintaining the phase difference $\theta_{D-R}$ between the detection signal 25 and the reference signal 27 to be fixed during the two-dimensional scanning with the primary beam 2.

FIG. 6 illustrates changes over time of the scanning signal and the primary beam intensity 22 when a specimen is two-dimensionally scanned with the primary beam 2 in accordance with the control. As illustrated in an enlarged view 60, the primary beam dwell time $T_S$ per pixel is set to be longer than the beam modulation period $T_M$ on the specimen, and when the primary beam dwell time $T_S$ is set to be a positive integer multiple of the beam modulation period $T_M$. In addition, an X-direction scanning signal 61 may have an interval time $T_I$ that is a period of time from end of X-direction scanning at one position to start of next X-direction scanning. In the control illustrated in FIG. 6, the modulation of the primary beam intensity 22 is reset at the interval time $T_I$, and the modulation restarts such that the phase is the same at a timing of start of X-direction scanning. Even with this control, the phase difference $\theta_{D-R}$ between the detection signal 25 and the reference signal 27 can be made to be fixed at all of the irradiation positions.

Second Modification Example

Even when the phase difference $\theta_{D-R}$ is set to be the same at all of the irradiation points of the primary beam 2 using the control methods illustrated in FIGS. 4, 5, and 6, there may be a phase deviation between the detection signal 25 and the reference signal 27 due to signal transmission delay caused by an environmental variation or a small noise. This modification example is a configuration where the phase adjustment amount of the phase adjuster 16 is adjusted such that a deviation of the phase difference $\theta_{D-R}$ does not lead to deterioration in the SEM image.

In the second modification example, the phase adjustment amount of the phase adjuster 16 can be automatically controlled such that the phase difference $\theta_{D-R}$ at an irradiation position corresponding to a pixel is corrected to 0 in the phase-sensitive detector 14. In the device configuration illustrated in FIG. 7, the computer 18 is configured such that the phase adjuster 16 can control the phase of the reference signal input to the phase-sensitive detector 14. The computer 18 causes the phase adjuster 16 to change the phase of the reference signal from 0° to 360°, and monitors the output of the low-pass filter 17. In the phase adjustment amount where the output of the low-pass filter 17 is the maximum, the phase difference between the detection signal and the reference signal input to the phase-sensitive detector 14 is 0. The computer 18 sets the phase adjustment amount where the output of the low-pass filter 17 is the maximum as the phase adjustment amount of the phase adjuster 16. A timing at which the phase adjustment amount of the phase adjuster 16 is controlled is not particularly limited. For example, a configuration of adjusting the phase adjustment amount of the phase adjuster 16 at a timing immediately before acquiring an image or a signal profile can be considered.

Third Modification Example

In order to extract the DC component $S_Dc$ from the output signal of the phase-sensitive detector 14 at a higher speed, a sample hold circuit 81 may be used instead of the low-pass filter 17. FIG. 8 illustrates a device configuration using the sample hold circuit. A sample hold circuit 81*a* for positive voltage detection and a sample hold circuit 81*b* for negative voltage detection are provided, and the output signal of the phase-sensitive detector 14 is input to each of the sample hold circuits. A sampling timing in the sample hold circuit 81 is set based on the reference signal of which the phase is adjusted by the phase adjuster 16. Here, the sampling timing is configured such that the reference signal of which the phase is shifted by 90° from the reference signal input to the sample hold circuit 81*a* for positive voltage detection by a phase adjuster 82 is input as the reference signal input to the sample hold circuit 81*b* for negative voltage detection. The signal that is held by the sample hold circuit 81 and output is input to the computer 18, and the computer 18 calculates an average value or a difference based on a maximum value and a minimum value of the output signal of the phase-sensitive detector 14. The average value or the difference value can be considered the output result when the low-pass filter 17 is used in a pseudo manner.

The signal output from the low-pass filter 17 has a low SNR, but the SNR of the signal is significantly improved as compared to the SEM in the related art. In the frequency modulation SEM using the sample hold circuit 81, only the maximum value and the minimum value in one period of the reference signal need to be acquired. Therefore, the primary beam dwell time $T_S$ per pixel and the beam modulation period $T_M$ can be made the same. As a result, the primary beam dwell time $T_S$ per unit pixel can be further reduced, and thus higher throughput and lower damage can be achieved.

The method of extracting the DC component $S_Dc$ from the output signal of the phase-sensitive detector 14 using the sample hold circuit 81 has been described. However, the same process can be performed using a method of directly inputting the output signal of the phase-sensitive detector 14 to the computer 18, converting the output signal into a digital signal, and detecting a peak.

Fourth Modification Example

The configuration example of the frequency modulation SEM can be implemented using the chopper 6 or the photo-excitation electron source 121 when the frequency modulation of the primary beam 2 and 120 is a square wave. As described above, the intensity modulation of the primary beam 2 does not need to be a square wave and may be a sine wave. FIG. 9 illustrates a device configuration where the frequency modulation of the primary beam 2 is a sine wave. When the frequency modulation is a sine wave, the lens strength in the electron optical system of the frequency modulation SEM may be changed. The lens strength can be modulated by a current in the case of an electromagnetic lens, and can be modulated by a voltage in the case of an electrostatic lens. In the example of FIG. 9 the primary beam 2 is modulated by modulating a voltage applied to an acceleration electrode 111. As illustrated in the drawing, by performing the frequency modulation with respect to the voltage applied to the acceleration electrode 111, the conditions for irradiating the specimen 10 with the primary beam 2 are modulated, and the intensity of the primary beam 2 per unit area is modulated. As a result, the intensity of the signal electrons 11 emitted is also modulated.

The voltage applied to the acceleration electrode 111 is not limited, and even by frequency-modulating a voltage applied to a deceleration electrode 112, a retarding voltage applied to the observation specimen 10, a voltage applied to the electron emission unit 1, a current applied to the focusing lenses 4 and 7 or the objective lens 9, or the like, the conditions for irradiating the specimen with the primary beam 2 can be modulated, and the intensity of the primary beam 2 per unit area can be modulated.

Fifth Modification Example

In the above-described embodiment or the modification examples, by modulating the primary beam 2, the intensity of the signal electrons 11 emitted is frequency-modulated. On the other hand, the SNR can be improved by frequency-modulating the detection system that detects the signal electrons 11 instead of the electron optical system. FIG. 10A illustrates a device configuration where the frequency modulation is performed on the detection system to frequency-modulate the detection signal. For example, when an E-T detector is used as a signal detector 90, the E-T detector includes a scintillator 91 configured to convert the signal electrons 11 into light by collision and a photomultiplier tube 92 configured to convert the light emitted from the scintillator 91 into an electric signal. In order to collect secondary electrons or backscattered electrons as the signal electrons 11, a voltage of several kV to several tens of kV is applied to the scintillator 91. To that end, in the fifth modification example, the signal generator 15 is provided in the detection system, and the voltage applied to the scintillator 91 that is generated by the signal generator 15 is frequency-modulated. As a result, the intensity of the light emitted from the scintillator 91 is modulated, and thus the detection signal from the signal detector 90 can be modulated.

In this configuration, by using the scintillator that responds to the scintillator 91 at a high speed, the scanning speed can be increased. The response speed of the scintillator, that is, the extinction time and the emission intensity have a trade-off relationship. Accordingly, in order to implement high-speed imaging in the SEM in the related art, even when an attempt to increase the scanning speed of the primary beam is made using the scintillator having a high response speed, the scintillator having a high response speed has a weak emission intensity and a poor SNR. Therefore, the scanning speed cannot be sufficiently increased or the number of images integrated needs to be increased, and thus, there is a limit in reducing the imaging time. On the other hand, in the frequency modulation SEM, the SNR can be improved by the frequency modulation. Therefore, the scintillator having a high response speed (for example, a scintillator having an extinction time of 10 ns or shorter) can be used in the signal detector 90. As a result, not only further improvement of throughput but also low-charging observation and low-contamination observation can be achieved.

The configuration is not limited to the frequency modulation of the voltage applied to the scintillator 91, and when an energy filter or the like for changing the collection efficiency of the signal electrons is disposed before the signal detector 90, it is also possible to frequency-modulate the detection signal by frequency-modulating the condition of the energy filter.

The fifth modification example can also be combined with another embodiment. In this case, the frequency modulation SEM performs both of the modulation of the primary beam 2 and the modulation of the detection system that detects the signal electrons 11. For example, the signal generator 15 is shared in the electron optical system and the detection system, and the control signal from the signal generator 15 is configured to be input to each of the chopper 6 and the scintillator 91. Here, for example, the phase adjuster or a delay circuit that can adjust the amount of delay is provided in at least one of the electron optical system or the detection system such that a phase difference between a phase for modulating the electron optical system and a phase for modulating the detection system can be adjusted. The signal generator may also be provided in each of the electron optical system and the detection system, and a method of controlling the phase difference is not particularly limited.

FIG. 10B illustrates a virtual detection signal 101 output from the signal detector 90 when the modulation of the detection system is not performed and a control voltage 103 applied to the scintillator 91 in the fifth modification example. When the control voltage 103 is in an ON state, the scintillator 91 emits light after receiving the signal electrons 11. When the control voltage 103 is in an OFF state, the scintillator 91 does not emit light even after receiving the signal electrons 11. For the virtual detection signal 101, a period of time is required to stabilize the signal due to the modulation of the primary beam 2. Therefore, by adjusting the phase difference between the phase for modulating the electron optical system and the phase for modulating the detection system, the detection signal output from the signal detector 90 can be narrowed down into a voltage stable region 102 of the virtual detection signal 101. Here, the signal stabilization is described as the example. However, noise or the like at the time of signal rise can be handled as illustrated in FIG. 10B.

In the example of FIG. 10B, the modulation frequency of the electron optical system and the modulation frequency of the detection system are the same. At this time, when the phase for modulating the electron optical system and the phase for modulating the detection system match each other, a variation in signal intensity may occur due to the effect of an unstable rise of the detection signal. On the other hand, when the phases are opposite to each other, the detection signal is not output. Accordingly, as the phase difference is changed from 0, the obtained image is slightly dark at an initial stage due to the effect of an unstable rise of the detection signal, and gradually becomes brighter along with a decrease in the effect of the rise. Further, as the phase difference increases, the amount of the detection signal decreases such that the obtained image becomes darker again. The phase difference where the brightness is the maximum is a phase difference where the SNR of the finally obtained image or signal profile is the maximum. This phase difference is also controlled to be fixed at all of the irradiation positions. A variation in phase difference depending on the irradiation positions causes a variation in brightness, which leads to a decrease in the SNR of the observation image.

Sixth Modification Example

Instead of making the primary beam dwell time $T_S$ per pixel the same at all of the beam irradiation positions, the primary beam dwell time $T_S$ per pixel or the beam modulation period $T_M$ can change depending on locations in a two-dimensional plane to be scanned. Note that the values are set such that the relationship where the primary beam dwell time $T_S$ per pixel is a positive integer multiple of the beam modulation period $T_M$ is maintained even after the change. In addition, even when the X-direction scanning period $T_L$ changes depending on scanning lines, the X-direction scanning period $T_L$ is controlled to be a positive integer multiple of the beam modulation period $T_M$ or the modulation is reset to have the same phase for each of the scanning lines.

FIG. 11 illustrates an example where a specimen observation image is divided into areas A to C and the primary beam dwell time $T_S$ or the beam modulation period $T_M$ is set for each of the areas. As compared to a primary beam dwell time $T_{SA}$ and a beam modulation period $T_{MA}$ set in the area A as a reference, $T_{SA}=T_{SB}$ and $T_{MA}>T_{MB}$ are satisfied in the area B, and $T_{MA}=T_M C$ and $T_{SC}>T_{SA}$ are satisfied in the area C. This way, regarding the primary beam dwell time $T_S$ per pixel and/or the beam modulation period $T_M$, the control value may change depending on the irradiation position, the material of the specimen, or the like.

FIG. 12 illustrates an example of an operation screen. The operation screen includes an acquired image display unit 141, a signal intensity monitor 142, a condition setting unit 143, and a phase setting unit 144. In the condition setting unit 143, various observation conditions, modulation conditions, and circuit conditions are input. The modulation conditions or the circuit conditions can be set while seeing the signal intensity monitor 142. In the condition setting unit 143, the value of SNR is calculated and displayed. While checking this value, the modulation frequency or the cutoff frequency of the high-pass filter or the low-pass filter can be set such that the desired SNR is satisfied. In the condition setting unit 143, the example of directly inputting the control value is illustrated. The value can also be selected using a pull-down method, or a plurality of preset optical modes can be provided such that the operator can select the optical mode in the condition setting unit 143. The phase adjustment amount by the phase adjuster 16 can also be manually adjusted by the operator in the phase setting unit 144 while seeing the signal intensity monitor, or can be automatically adjusted as described in the second modification example. In the case of the manual input, the phase amount may be adjusted using a slider of the phase setting unit 144, or any numerical value of phase amount may be input. Each condition is not independently set, and a SEM image observed under the set various conditions is displayed in the acquired image display unit 141.

FIG. 13 illustrates an operation screen example where the primary beam dwell time $T_S$ per pixel or the beam modulation period $T_M$ that varies depending on the areas illustrated in FIG. 11 is set. An image acquisition area is divided in an area selection unit 151, and the primary beam dwell time $T_S$ or the beam modulation period $T_M$ is set for each of the divided areas in the condition setting unit 152. The division of the image acquisition area and the conditions for each of the divided areas may be preset such that the operator can call up the settings from the condition setting unit 152.

Second Embodiment

In the first embodiment, the example where the phase-sensitive detector performs the synchronous detection using an analog signal is described. On the other hand, a computer can also perform the synchronous detection using digital processing. In the second embodiment, a frequency modulation SEM using the digital processing (hereinafter, referred to as "digital frequency modulation SEM") will be described.

FIG. 14 illustrates a basic device configuration of the digital frequency modulation SEM. FIG. 14 illustrates the configuration corresponding to the frequency modulation SEM illustrated in FIG. 1, and the digital processing that is executed by a computer 71 is displayed as functional blocks. The configuration is not limited to the frequency modulation SEM illustrated in FIG. 1, and the corresponding digital processing can be applied to each of the modification examples of the first embodiment.

The functional blocks relating to the synchronous detection of the digital frequency modulation SEM include an AD conversion unit 73, a synchronous detection unit 74, a signal generation unit 75, a phase adjustment unit 76, a low-pass filter 77, and a control unit 78. The synchronous detection unit 74, the signal generation unit 75, the phase adjustment unit 76, the low-pass filter 77, and the control unit 78 are functional blocks corresponding to the phase-sensitive detector 14, the signal generator 15, the phase adjuster 16, the low-pass filter 17, and the computer 18 of the frequency modulation SEM illustrated in the first embodiment, respectively, and the description thereof will not be repeated. In the frequency modulation SEM, the output of the low-pass filter 17 is converted into a digital signal, and the digital signal is taken into the computer 18. On the other hand, in the digital frequency modulation SEM, the output of the amplifier 13 is converted into a digital signal by the AD conversion unit 73, and the detection signal as the digital signal is taken into the computer 71 based on a sampling signal.

FIG. 15 illustrates an acquisition flow of the detection signal in the digital frequency modulation SEM. When the signal electrons 11 are detected by the signal detector (S01), the detection signal from the signal detector 12 is amplified by the amplifier 13, is converted into a digital signal and sampled by the AD conversion unit 73, and is taken into the computer 71 as the digital signal (S02). Here, the intensity of the detection signal from the signal detector 12 is frequency-modulated by frequency-modulating the beam intensity of the primary beam 2. In order to reproduce the continuous waveform of the detection signal (analog signal), based on the sampling theorem, it is necessary to satisfy a relationship that the sampling frequency of the AD conversion unit 73 is higher than two times the modulation frequency of the primary beam 2. This point is different from the first embodiment where the output signal of the low-pass filter 17 is taken into the computer. The reason for this is that, since the output signal of the low-pass filter 17 is the DC component, it is not necessary to place a restriction based on the relationship with the sampling frequency of the AD conversion unit on the modulation frequency of the primary beam 2.

The detection signal as the digital signal converted by the AD conversion unit 73 is sampled based on the sampling signal and the synchronous detection is performed by the synchronous detection unit 74. As illustrated in FIG. 16, for a detection signal 161 from the signal detector 12, a period of time is required to stabilize the signal due to the modulation of the primary beam 2 at the time of rise of the signal. Therefore, it is desirable to exclude output voltage values outside a voltage stable region 162 of the detection signal 161 for the signal processing. Therefore, the frequency of a sampling signal 163 for sampling the detection signal converted into the digital signal by the AD conversion unit 73 is set to be two times or more of the modulation frequency of the detection signal (here, the frequency of the modulation signal of the primary beam 2), and the detection signal (here, the modulation signal of the primary beam 2) and the sampling signal 163 are synchronized with each other. By setting the frequency of the sampling signal 163 to be two times or more of the modulation frequency of the detection signal, the detection signal during irradiation with the primary beam 2 can be reliably acquired. In addition, the sampling frequency of the AD conversion unit 73 is set to be sufficiently high, and the frequency of the sampling signal 163 is set to be lower than or equal to the sampling frequency of the AD conversion unit 73.

By adjusting a phase difference between the detection signal and the sampling signal 163 of the AD conversion unit 73, the effect of an unstable rise of the detection signal 161 can be reduced. FIG. 16 illustrates an example where the frequency of the sampling signal 163 is adjusted to be two times of the frequency of the detection signal 161 and the phase difference therebetween is adjusted such that the sampling period falls within the voltage stable region 162 of the detection signal 161. As the optimum phase difference, a phase difference where the obtained image has the maximum brightness (the pixel value is the maximum) may be selected while changing the phase difference between the modulation signal of the primary beam 2 and the sampling signal 163. As a result, the SNR of the finally obtained image or signal profile is improved.

The modulation signal of the primary beam 2 and the sampling signal 163 of the AD conversion unit 73 are synchronized with each other such that the effect of noise can be made uniform irrespective of the irradiation positions of the primary beam 2 on the specimen. In the example of FIG. 16, the duty ratio of the sampling signal 163 for turning ON/OFF sampling is set to 50%. However, the duty ratio is not limited to this value.

In addition, in the above-described configuration, by allowing the AD conversion unit 73 to further sample the detection signal as the digital signal based on the sampling signal under the condition satisfying the sampling theorem, the AD conversion can be performed at the fixed sampling frequency irrespective of the modulation frequency of the detection signal. The sampling frequency of the AD conversion unit 73 may be controlled in association with the modulation frequency of the detection signal. In this case, the sampling frequency of the AD conversion unit 73 is synchronized with the modulation frequency of the detection signal, and the phase difference between the sampling period of the AD conversion unit 73 and the modulation period of the detection signal is adjusted. As a result, the effect of an unstable rise of the detection signal 161 can be reduced.

It is also effective to filter the input digital signal through a high-pass filter or a low-pass filter to suppress a noise component of other than the desired frequency (S03). Next, in the synchronous detection unit 74, the sampled digital signal is multiplied by the reference signal output from the phase adjustment unit 76 (S04). The reference signal may be a digital signal converted from an analog signal or may be a digital signal or a fixed value generated in the computer 71. In addition, the signal waveform of the reference signal may be a sine wave or may be a square wave.

Instead of sequentially multiplying the sampled digital signals, the sampled digital signal may be temporarily stored in a storage device of the computer 71 in a one-dimensional form or a two-dimensional form (for example, in an image form), and the stored digital signal may be collectively multiplied by the reference signal that is also generated in a one-dimensional form or a two-dimensional form. Here, storing in a one-dimensional form represents that the digital signals or the reference signals taken in based on the sampling signal are sequentially arranged in a time series and stored. The signals that are arranged in a time series may be digital signals that are taken in or may be the results obtained by performing either or both of filtering and arithmetic processing on the digital signals. In addition, data stored in a one-dimensional form may be data regarding only one irradiation position or may be one-dimensional form data where data regarding a plurality of irradiation positions are arranged in a time series. Storing in a two-dimensional form represents storing a plurality of pieces of one-dimensional form data. A plurality of pieces of the same one-dimensional form data may be stored, or different one-dimensional form data may be stored.

Next, a low-pass filter 77 outputs a desired signal component from a value obtained by multiplying the reference signal and the digital signal by each other (S05), and the control unit 78 images the output of the low-pass filter 77

(S06). At this time, for example, integration of data in a given period or movement integration may be used instead of the low-pass filter 77. In addition, the output data of the low-pass filter may be averaged to construct data of one pixel.

The digital frequency modulation SEM does not require the analog signal processing circuits such as the phase-sensitive detector 14, the phase adjuster 16, and the low-pass filter 17, and thus can adopt a simpler configuration than the frequency modulation SEM described in the first embodiment. Since the analog circuits are not necessary, circuit noise of the phase-sensitive detector 14 and the like can be reduced, the shape, the cutoff frequency, and the like of the filter can be freely adjusted easily, and the filter design optimum for the observation target can be achieved. This way, in the digital frequency modulation SEM, the SNR or the dynamic range of the observation image can be easily improved with the simple configuration.

Hereinabove, the present disclosure has been described using the embodiments and the modification examples. The present disclosure is not limited to the embodiments and the modification examples described above, and combinations of the configurations described in the embodiments and the modification examples or changes, replacements, deletions, and the like of a part of the components can also be made.

In addition, secondary electrons and backscattered electrons are described as the example of the signal electrons 11. However, the signal electrons 11 may be other electrons or other charged particles. In addition, light or an electromagnetic wave such as an X-ray may be detected, and the signal detection method according to the present disclosure may be used for the detection signal thereof. When the detection target is light or an electromagnetic wave such as an X-ray, a detector that detects the light or the X-ray may be used as the detector, and an optical mirror, a condenser lens, or a condensing mirror may be disposed at an appropriate position in order to detect the light or the X-ray emitted from a specimen.

In addition, the specimen 10 may be a biological specimen. The biological specimen is affected by an electron beam more strongly than an inorganic material. Therefore, it can be said that the biological specimen is an observation target that is particularly effective for use in the frequency modulation SEM according to the present disclosure. When the biological specimen is observed, the specimen needs to be observed in an environment where the biological specimen is not damaged, for example by holding the specimen in a capsule for underwater observation or by disposing the specimen in a low vacuum environment.

In addition, the SEM is described as the example of the charged particle beam device. However, the configuration and the effects of the present disclosure are not limited to the application to the SEM and are also applicable to a scanning transmission electron microscope (STEM), a device where an ion beam is used as a charged particle beam, or a device having similar configurations including the function of irradiation with a charged particle beam and the function of detecting a signal generated by the irradiation.

REFERENCE SIGNS LIST

1: electron emission unit
2: primary beam
3: acceleration electrode
4, 7: focusing lens
5: aperture
6: chopper
8: deflector
9: objective lens
10: specimen
11: signal electron
12, 90: signal detector
13: amplifier
14: phase-sensitive detector
15: signal generator
16: phase adjuster
17, 77: low-pass filter
18, 71: computer
21: scanning signal
22: primary beam intensity
25: detection signal
27: reference signal
30, 60: enlarged view
31: X-direction scanning signal
32: Y-direction scanning signal
61: X-direction scanning signal
73: AD conversion unit
74: synchronous detection unit
75: signal generation unit
76: phase adjustment unit
78: control unit
81: sample hold circuit
82: phase adjuster
91: scintillator
92: photomultiplier tube
101: virtual detection signal
102, 162: voltage stable region
103: control voltage
111: acceleration electrode
112: deceleration electrode
120: pulsed primary beam
121: photo-excitation electron source
122: pulsed laser
123: photodetector
131: high-pass filter
141: acquired image display unit
142: signal intensity monitor
143: condition setting unit
144: phase setting unit
151: area selection unit
152: condition setting unit
161: detection signal
163: sampling signal

The invention claimed is:

1. A charged particle beam device comprising:

a charged particle optical system including a charged particle source, one or more lenses configured to focus a charged particle beam from the charged particle source on a specimen, and a deflector configured to deflect the charged particle beam to scan the specimen;

a detection system including a detector configured to detect signal charged particles or an electromagnetic wave emitted by irradiating the specimen with the charged particle beam; and a computer configured to control the charged particle optical system to scan the specimen with the charged particle beam and to generate an image or a signal profile based on a detection signal output from the detector when the detector detects signal charged particles or an electromagnetic wave emitted by irradiating an irradiation position corresponding to one pixel with the charged particle beam, wherein the computer controls at least one of the charged particle optical system or the detection system so as to modulate an intensity of the signal charged particles or the electromagnetic wave detected by the detector at a predetermined frequency, and generates the image or the signal profile by associating an irradiation position of the charged particle beam with a DC component of a signal, which is acquired through synchronous detection of a detection signal from the detector at the irradiation position with a reference signal having the predetermined frequency, the detection system includes a phase-sensitive detector configured to input the detection signal from the detector and the reference signal for the synchronous detection and a phase adjuster configured to adjust a phase of the reference signal input to the phase-sensitive detector, and the computer sets a period where the irradiation position corresponding to one pixel is irradiated with the charged particle beam to be a positive integer multiple of a modulation period of the intensity of the signal charged particles or the electromagnetic wave detected by the detector and adjusts a phase adjustment amount of the reference signal by the phase adjuster to be a phase difference of zero between the detection signal from the detector and the reference signal input to the phase-sensitive detector, wherein the charged particle optical system two-dimensionally scans the specimen by repeatedly scanning the specimen with the charged particle beam in a first direction while shifting the position in a direction perpendicular to the first direction, and the computer sets a period of time from start of scanning in the first direction at one position to start of scanning in the first direction at a next position to be a positive integer multiple of a modulation period of the intensity of the signal charged particles or the electromagnetic wave detected by the detector, or at a timing of start of scanning in the first direction, the computer resets the modulation of the signal charged particles or the electromagnetic wave detected by the detector per scanning in the first direction such that the modulation of the intensity of the signal charged particles or the electromagnetic wave detected by the detector has the same phase.

2. The charged particle beam device according to claim 1, wherein the detection system includes a low-pass filter configured to output a DC component of an output signal of the phase-sensitive detector.

3. The charged particle beam device according to claim 2, wherein the computer sets the phase adjustment amount of the reference signal by the phase adjuster where an output of the low-pass filter is a maximum when the computer causes the phase adjuster to change the phase of the reference signal from 0° to 360° prior to the generation of the image or the signal profile.

4. The charged particle beam device according to claim 1, wherein the charged particle optical system modulates an intensity of the charged particle beam per unit area on the specimen at the predetermined frequency.

5. The charged particle beam device according to claim 4, wherein the charged particle optical system includes a signal generator configured to generate a control signal having the predetermined frequency and a chopper that is controlled based on the control signal generated by the signal generator, and the charged particle beam is pulsed in a period of the control signal generated by the signal generator.

6. The charged particle beam device according to claim 4, wherein the charged particle source is a photo-excitation electron source, the charged particle optical system includes a signal generator configured to generate a control signal having the predetermined frequency and a pulsed laser that is controlled based on the control signal generated by the signal generator, and the charged particle beam is a pulsed electron beam emitted when the photo-excitation electron source is irradiated with pulsed light that is output from the pulsed laser and has a period of the control signal generated by the signal generator.

7. The charged particle beam device according to claim 1, wherein the charged particle source is a photo-excitation electron source, the charged particle optical system includes a pulsed laser configured to output pulsed light and a photodetector, the charged particle beam is a pulsed electron beam emitted when the photo-excitation electron source is irradiated with the pulsed light that is output from the pulsed laser, and an output signal output from the photodetector when the photodetector detects the pulsed light output from the pulsed laser is set as the reference signal.

8. The charged particle beam device according to claim 1, wherein the detection system modulates the intensity of the signal charged particles or the electromagnetic wave detected by the detector at the predetermined frequency.

9. The charged particle beam device according to claim 8, wherein the detector includes a signal generator configured to generate a control signal having the predetermined frequency, a scintillator configured to convert electrons emitted by irradiating the specimen with the charged particle beam into light, and a photomultiplier tube configured to detect the converted light, the detection system modulates a voltage applied to the scintillator at the predetermined frequency based on the control signal generated by the signal generator, and the scintillator has an extinction time of 10 ns or shorter.

10. The charged particle beam device according to claim 1, wherein the detection system includes an amplifier configured to amplify the detection signal from the detector, and the detection signal from the detector that is amplified by the amplifier is filtered and subsequently undergoes the synchronous detection with the reference signal.

11. The charged particle beam device according to claim 1, wherein the computer converts the detection signal from the detector into a digital signal and takes in the digital signal, and a sampling frequency at which the computer converts the detection signal from the detector into a digital signal is two times or more of a modulation frequency of the intensity of the signal charged particles or the electromagnetic wave detected by the detector.

12. A specimen observation method using a charged particle beam device including a charged particle optical system, a detection system, and a computer, the charged particle optical system including a charged particle source, one or more lenses configured to focus a charged particle beam from the charged particle source on a specimen, and a deflector configured to deflect the charged particle beam to scan the specimen, the detection system including a detector configured to detect signal charged particles or an electromagnetic wave emitted by irradiating the specimen with the charged particle beam, a phase-sensitive detector configured to input the detection signal from the detector and the reference signal for the synchronous detection and a phase adjuster configured to adjust a phase of the reference signal input to the phase-sensitive detector and the specimen observation method comprising:

allowing the computer to set at least one of the charged particle optical system or the detection system so as to modulate an intensity of the signal charged particles or the electromagnetic wave detected by the detector at a predetermined frequency;

allowing the charged particle optical system to scan the specimen two-dimensionally by repeatedly scanning the specimen with the charged particle beam in a first direction while shifting the position in a direction perpendicular to the first direction; and allowing the computer to generate an image or a signal profile based on a detection signal output from the detector when the detector detects signal charged particles or an electromagnetic wave emitted by irradiating an irradiation position corresponding to one pixel with the charged particle beam;

wherein the image or the signal profile is generated by associating an irradiation position of the charged particle beam with a DC component of a signal, which is acquired through synchronous detection of a detection signal from the detector at the irradiation position with a reference signal having the predetermined frequency;

wherein the computer sets a period where the irradiation position corresponding to one pixel is irradiated with the charged particle beam to be a positive integer multiple of a modulation period of the intensity of the signal charged particles or the electromagnetic wave detected by the detector and adjusts a phase adjustment amount of the reference signal by the phase adjuster to be a phase difference of zero between the detection signal from the detector and the reference signal input to the phase-sensitive detector, and the computer sets a period of time from start of scanning in the first direction at one position to start of scanning in the first direction at a next position to be a positive integer multiple of a modulation period of the intensity of the signal charged particles or the electromagnetic wave detected by the detector, or at a timing of start of scanning in the first direction, the computer resets the modulation of the signal charged particles or the electromagnetic wave detected by the detector per scanning in the first direction such that the modulation of the intensity of the signal charged particles or the electromagnetic wave detected by the detector has the same phase.

13. The specimen observation method according to claim 12, wherein the computer sets a period where the irradiation position corresponding to one pixel is irradiated with the charged particle beam to be a positive integer multiple of a modulation period of the intensity of the signal charged particles or the electromagnetic wave detected by the detector, and the period varies depending on the modulation period or areas of the specimen.

14. The specimen observation method according to claim 12, wherein the computer adjusts the phase adjustment amount of the reference signal by the phase adjuster prior to the generation of the image or the signal profile.

15. A charged particle beam device comprising:

a charged particle optical system including a charged particle source, one or more lenses configured to focus a charged particle beam from the charged particle source on a specimen, and a deflector configured to deflect the charged particle beam to scan the specimen;

a detection system including a detector configured to detect signal charged particles or an electromagnetic wave emitted by irradiating the specimen with the charged particle beam;

a computer configured to control the charged particle optical system to scan the specimen two-dimensionally by repeatedly scanning the specimen with the charged particle beam in a first direction while shifting the position in a direction perpendicular to the first direction and to generate an image or a signal profile based on a detection signal output from the detector when the detector detects signal charged particles or an electromagnetic wave emitted by irradiating an irradiation position corresponding to one pixel with the charged particle beam, wherein the computer controls at least one of the charged particle optical system or the detection system so as to modulate an intensity of the signal charged particles or the electromagnetic wave detected by the detector at a predetermined frequency, and generates the image or the signal profile by associating an irradiation position of the charged particle beam with a DC component of a signal, which is acquired through synchronous detection of a detection signal from the detector at the irradiation position with a reference signal having the predetermined frequency, wherein the computer sets a period where the irradiation position corresponding to one pixel is irradiated with the charged particle beam to be a positive integer multiple of a modulation period of the intensity of the signal charged particles or the electromagnetic wave detected by the detector, the computer sets a period of time from start of scanning in the first direction at one position to start of scanning in the first direction at a next position to be a positive integer multiple of a modulation period of the intensity of the signal charged particles or the electromagnetic wave detected by the detector, or at a timing of start of scanning in the first direction, the computer resets the modulation of the signal charged particles or the electromagnetic wave detected by the detector per scanning in the first direction such that the modulation of the intensity of the signal charged particles or the electromagnetic wave detected by the detector has the same phase, the computer converts the detection signal from the detector into a digital signal and takes in the digital signal based on a sampling signal, sets a frequency of the sampling signal to be two times or more of a modulation frequency of the intensity of the signal charged particles or the electromagnetic wave detected by the detector, and executes a control such that the modulation of the intensity of the signal charged particles and the electromagnetic wave detected by the detector and the sampling signal are synchronized with a predetermined phase difference, and the computer adjusts a phase adjustment amount of the reference signal to be a phase difference of zero between the detection signal from the detector and the reference signal for the synchronous detection.

16. The charged particle beam device according to claim 15, wherein the predetermined phase difference is determined such that a pixel value of the image or the signal profile is maximized.

17. The charged particle beam device according to claim 8, wherein the charged particle optical system modulates an intensity of the charged particle beam per unit area on the specimen at the predetermined frequency, and at least one of the charged particle optical system and the detection system is configured to adjust a phase difference between a phase for modulating the charged particle optical system and a phase for modulating the detection system.

* * * * *